(12) United States Patent
Shin et al.

(10) Patent No.: US 12,557,701 B2
(45) Date of Patent: Feb. 17, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Dong Hee Shin, Yongin-si (KR); No Kyung Park, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 570 days.

(21) Appl. No.: 17/973,856

(22) Filed: Oct. 26, 2022

(65) Prior Publication Data

US 2023/0178691 A1   Jun. 8, 2023

(30) Foreign Application Priority Data

Dec. 2, 2021   (KR) .......................... 10-2021-0171295

(51) Int. Cl.
| | |
|---|---|
| *H01L 25/075* | (2006.01) |
| *H01L 25/16* | (2023.01) |
| *H10H 29/01* | (2025.01) |
| *H10H 29/03* | (2025.01) |
| *H10H 29/37* | (2025.01) |
| *H10H 29/49* | (2025.01) |

(52) U.S. Cl.
CPC ........ *H01L 25/0753* (2013.01); *H01L 25/167* (2013.01); *H10H 29/03* (2025.01); *H10H 29/0364* (2025.01); *H10H 29/37* (2025.01); *H10H 29/49* (2025.01)

(58) Field of Classification Search
CPC . H01L 25/0753; H01L 25/167; H10H 29/012; H10H 29/03; H10H 29/032; H10H 29/30–49
See application file for complete search history.

(56) References Cited

U.S. PATENT DOCUMENTS

| | | |
|---|---|---|
| 10,084,031 B2 | 9/2018 | Park et al. |
| 2021/0066561 A1* | 3/2021 | Chang ................. H01L 25/0753 |
| 2021/0159250 A1 | 5/2021 | Chang et al. |

FOREIGN PATENT DOCUMENTS

| | | | | |
|---|---|---|---|---|
| CN | 111952329 A | * | 11/2020 | ......... H10K 59/8792 |
| KR | 10-2018-0036818 | | 4/2018 | |
| KR | 10-2021-0065238 | | 6/2021 | |
| KR | 10-2021-0080924 A | | 7/2021 | |

* cited by examiner

*Primary Examiner* — Zandra V Smith
*Assistant Examiner* — Molly K Reida
(74) *Attorney, Agent, or Firm* — Womble Bond Dickinson (US) LLP

(57) ABSTRACT

A display device includes a pixel including an emission area and a non-emission area, a bank disposed in the non-emission area, an insulating layer disposed on the bank, light emitting elements disposed in the emission area, and connection electrodes electrically connected to the light emitting elements. The insulating layer overlaps a first area of the bank, and includes an opening exposing a second area of the bank in a plan view. The connection electrodes overlap the first area of the bank in a plan view.

9 Claims, 14 Drawing Sheets

DISPLAY DEVICE AND METHOD OF MANUFACTURING THE DISPLAY DEVICE

CROSS-REFERENCE TO RELATED APPLICATION(S)

This application claims priority to and benefits of Korean patent application 10-2021-0171295 under 35 U.S.C. § 119(a), filed on Dec. 2, 2021 in the Korean Intellectual Property Office (KIPO), the entire contents of which are incorporated herein by reference.

BACKGROUND

1. Technical Field

The disclosure generally relates to a display device and a method of manufacturing the display device.

2. Description of the Related Art

Recently, as interest in information displays is increased, research and development of display devices has been continuously conducted.

SUMMARY

Embodiments provide a display device and a method of manufacturing the display device, which can improve alignment of light emitting elements and prevent disconnection of connection electrodes.

In accordance with an aspect of the disclosure, there is provided a display device that may include a pixel including an emission area and a non-emission area, a bank disposed in the non-emission area, an insulating layer disposed on the bank, light emitting elements disposed in the emission area, and connection electrodes electrically connected to the light emitting elements. The insulating layer may overlap a first area of the bank, and may include an opening exposing a second area of the bank in a plan view, and the connection electrodes may overlap with the first area of the bank in a plan view.

The connection electrodes may not overlap the opening of the insulating layer in a plan view.

The insulating layer may overlap a side surface of the bank in a plan view.

The second area of the bank may be water repellant.

A thickness of the first area of the bank may be greater than a thickness of the second area of the bank.

The display device may further include electrodes spaced apart from each other in the emission area. The light emitting elements may be disposed between the electrodes.

The insulating layer may be disposed between the electrodes and the light emitting elements.

The connection electrodes may include a first connection electrode electrically connected to first end portions of the light emitting elements, and a second connection electrode electrically connected to second end portions of the light emitting elements.

The first connection electrode and the second electrode may be disposed on a same layer.

The display device may further include another insulating layer disposed between the first connection electrode and the second connection electrode.

In accordance with another aspect of the disclosure, there is provided a method of manufacturing a display device. The method may include forming electrodes spaced apart from each other in an emission area, forming a bank in a non-emission area, forming an insulating layer on the electrodes and a first area and a second area of the bank, forming an opening exposing the second area of the bank by etching the insulating layer, and forming connection electrodes on the first area of the bank.

The connection electrodes may be formed directly on the insulating layer in the non-emission area.

The method may further include surface treating the second area of the bank.

The second area of the bank may be water repellant.

The insulating layer may be formed on a side surface of the bank.

The second area of the bank may be partially etched in the forming of the opening of the insulating layer.

The method may further include providing light emitting elements between the electrodes. The connection electrodes may be electrically connected to the light emitting elements.

The forming of the connection electrodes may include forming a first connection electrode on first end portions of the light emitting elements, and forming a second connection electrode on second end portions of the light emitting elements.

The first connection electrode and the second connection electrode may be simultaneously formed.

The method may further include forming another insulating layer between the first connection electrode and the second connection electrode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
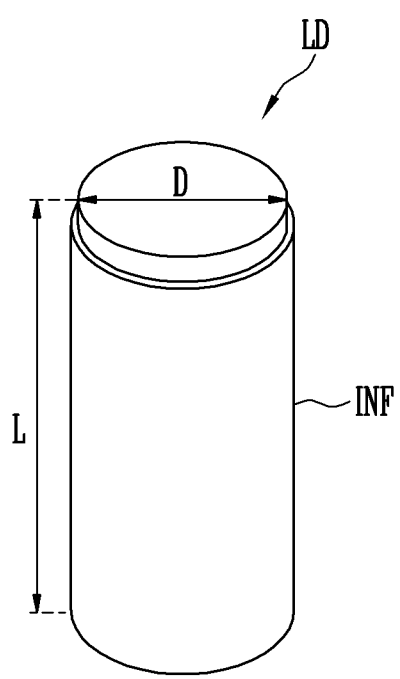
FIG. 1 is a schematic perspective view illustrating a light emitting element in accordance with an embodiment of the disclosure.

Hereinafter, embodiments of the disclosure will be described in more detail with reference to the accompanying drawings. The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that a person of ordinary skill in the art can fully understand the features in the disclosure and the scope thereof.

The terminology used herein is for the purpose of describing particular embodiments only and is not construed as limiting. As used herein, the singular forms are intended to include the plural forms as well, unless the context clearly indicates otherwise. The terms "comprises/includes/has" and/or "comprising/including/having," when used in this specification, specify the presence of the one or more mentioned component, step, operation and/or element, but do not exclude the presence or addition of one or more other components, steps, operations and/or elements.

When an element is described as "connected", "coupled" or "accessed" to another element, it should be understood that it is possible that still another element may be "connected", "coupled" or "accessed" between the two elements as well as that the two elements are directly "connected", "coupled" or "accessed" to each other.

The term "on" that is used to designate that an element or layer is on another element or layer includes both a case where an element or layer is located directly on another element or layer, and a case where an element or layer is located on another element or layer via still another element or layer. Like reference numerals generally denote like elements throughout the specification.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
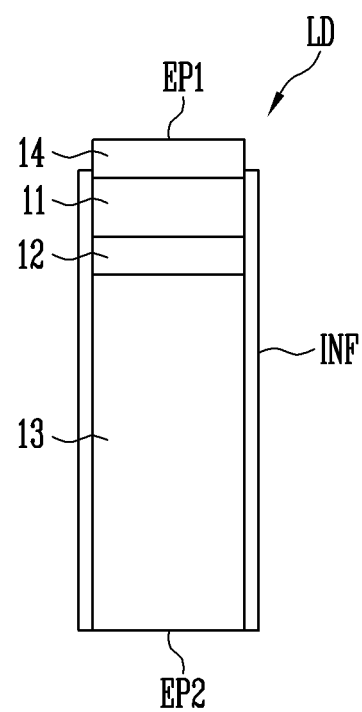
FIG. 2 is a schematic sectional view illustrating a light emitting element in accordance with an embodiment of the disclosure.

FIG. 1 is a schematic perspective view illustrating a light emitting element in accordance with an embodiment of the disclosure. FIG. 2 is a schematic sectional view illustrating a light emitting element in accordance with an embodiment of the disclosure. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending along a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In some embodiments, the light emitting element LD may be a light emitting element manufactured in a pillar shape through an etching process, etc. In this specification, the term "pillar shape" may include a rod-like shape or bar-like shape, of which aspect ratio may be greater than 1, such as a cylinder or a polyprism, and the shape of its section is not particularly limited.

The light emitting element LD may have a size small to a degree of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices, e.g., a display device, and the like, which use, as a light source, a light emitting device using the light emitting element LD.

The first semiconductor layer 11 may be a first conductivity type semiconductor layer. For example, the first semiconductor layer 11 may include a p-type semiconductor layer. In an example, the first semiconductor layer 11 may include at least one semiconductor material among InAlGaN, GaN, AlGaN, InGaN, AlN, and InN, and include a p-type semiconductor layer doped with a first conductivity type dopant such as Mg. However, the material constituting the first semiconductor layer 11 is not limited thereto. The first semiconductor layer 11 may be configured with various materials.

The active layer 12 may be disposed between the first semiconductor layer 11 and the second semiconductor layer 13. The active layer 12 may include at least one structure among a single well structure, a multi-well structure, a single quantum well structure, a multi-quantum well (MQW) structure, a quantum dot structure, and a quantum wire structure, but the disclosure is not limited thereto. The active layer 12 may include GaN, InGaN, InAlGaN, AlGaN, AlN, or the like, or a combination thereof. The active layer 12 may be configured with various materials.

In case that a voltage which may be a threshold voltage or more is applied to both ends of the light emitting element LD, the light emitting element LD emits light as electron-hole pairs are combined in the active layer 12. The light emission of the light emitting element LD may be controlled by using such a principle, so that the light emitting element LD can be used as a light source for various light emitting devices, including a pixel of a display device.

The second semiconductor layer 13 may be formed on the active layer 12, and may include a semiconductor layer having a type different from that of the first semiconductor layer 11. For example, the second semiconductor layer 13 may include an n-type semiconductor layer. In an example, the second semiconductor layer 13 may include at least one semiconductor material among InAlGaN, GaN, AlGaN, InGaN, AlN, and InN, and include an n-type semiconductor layer doped with a second conductivity type dopant such as Si, Ge or Sn, or a combination thereof. However, the material constituting the second semiconductor layer 13 is not limited thereto. The second semiconductor layer 13 may be configured with various materials.

The electrode layer 14 may be disposed on the first end portion EP1 and/or the second end portion EP2 of the light emitting element LD. Although a case where the electrode layer 14 may be formed on the first semiconductor layer 11 is disclosed in FIG. 2, the disclosure is not necessarily limited thereto. For example, a separate electrode layer may be further disposed on the second semiconductor layer 13.

The electrode layer 14 may include a transparent metal or a transparent metal oxide. In an example, the electrode layer 14 may include at least one of indium tin oxide (ITO), indium zinc oxide (IZO), zinc oxide (ZnO), and zinc tin oxide (ZTO), but the disclosure is not necessarily limited thereto. When the electrode layer 14 may be made of a transparent metal or a transparent metal oxide, light generated in the active layer 12 of the light emitting element LD may pass through the electrode layer 14 and be emitted to the outside of the light emitting element LD.

An insulative film INF may be provided on a surface of the light emitting element LD. The insulative film INF may be disposed directly on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In some embodiments, the insulative film INF may expose a side portion of the electrode layer 14 and/or the second semiconductor layer 13, adjacent to the first and second end portions EP1 and EP2 of the light emitting element LD.

The insulative film INF may prevent an electrical short circuit which may occur in case that the active layer 12 is in contact with a conductive material except the first and second semiconductor layers 11 and 13. Also, the insulative film INF may minimize a surface defect of light emitting elements LD, thereby improving the lifetime and light emission efficiency of the light emitting elements LD.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be configured as a double layer, and layers constituting the double layer may include different materials. In an example, the insulative film INF may be configured as a double layer including aluminum oxide ($AlO_x$) and silicon oxide ($SiO_x$), but the disclosure is not necessarily limited thereto. In some embodiments, the insulative film INF may be omitted.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

Figure 3:
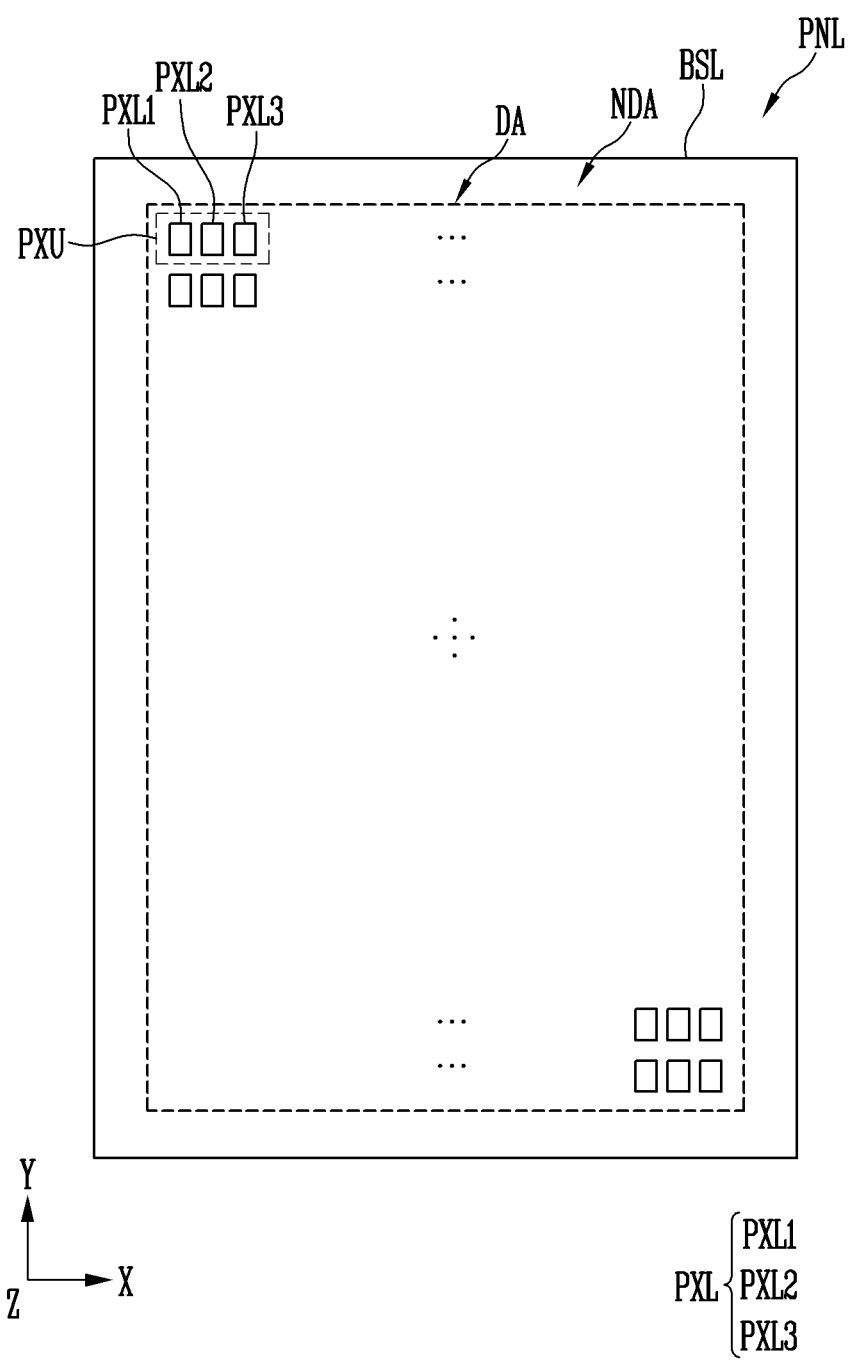
FIG. 3 is a schematic plan view illustrating a display device in accordance with an embodiment of the disclosure.

FIG. 3 is a schematic plan view illustrating a display device in accordance with an embodiment of the disclosure.

In FIG. 3, a display device, particularly, a display panel PNL provided in the display device will be illustrated as an example of an electronic device which can use, as a light source, the light emitting element LD described in an embodiment shown in FIGS. 1 and 2.

For convenience of description, in FIG. 3, a structure of the display panel PNL will be briefly illustrated based on a display area DA. However, in some embodiments, at least one driving circuit (e.g., at least one of a scan driver and a data driver), lines, and/or pads, which are not shown in the drawing, may be further disposed in the display panel PNL.

Referring to FIG. 3, the display panel PNL and a base layer BSL for forming the same may include the display area DA for displaying an image and a non-display area NDA except the display area DA. The display area may constitute a screen on which the image may be displayed, and the non-display area NDA may be another area except the display area DA.

A pixel unit PXU may be disposed in the display area DA. The pixel unit PXU may include a first pixel PXL1, a second pixel PXL2, and/or a third pixel PXL3. Hereinafter, when at least one pixel among the first pixel PXL1, the second pixel PXL2, and the third pixel PXL3 is arbitrarily designated or when two or more kinds of pixels among the first pixel PXL1, the second pixel PXL2, and the third pixel PXL3 are inclusively designated, the corresponding pixel or the corresponding pixels will be referred to as a "pixel PXL" or "pixels PXL."

The pixels PXL may be regularly arranged according to a stripe structure, a PenTile® structure, or the like. However, the arrangement structure of the pixels PXL is not limited thereto, and the pixels PXL may be arranged in the display area DA by using various structures and/or methods.

In some embodiments, two or more kinds of pixels PXL may emit lights of different colors. In an example, first pixels PXL1 emitting light of a first color, second pixels PXL2 emitting light of a second color, and third pixels PXL3 emitting light of a third color may be arranged in the display area DA. At least one first pixel PXL1, a least one second pixel PXL2, and at least one third pixel PXL3, which may be disposed adjacent to each other, may constitute one pixel unit PXU capable of emitting lights of various colors. For example, each of the first to third pixels PXL1, PXL2, and PXL3 may be a pixel emitting light of a color. In some embodiments, the first pixel PXL1 may be a red pixel emitting red light, the second pixel PXL2 may be a green pixel emitting green light, and the third pixel PXL3 may be a blue pixel emitting blue light. However, the disclosure is not limited thereto.

In an embodiment, the first pixel PXL1, the second pixel PXL2, and the third pixel PXL3 may have light emitting elements emitting light of a same color, and may include color conversion layers and/or color filters of different colors, which may be disposed on the respective light emitting elements, to respectively emit lights of the first color, the second color, and the third color. In another embodiment, the first pixel PXL1, the second pixel PXL2, and the third pixel PXL3 respectively have, as light sources, a light emitting element of the first color, a light emitting element of the second color, and a light emitting element of the third color, so that the light emitting elements can respectively emit lights of the first color, the second color, and the third color. However, the color, kind, and/or number of pixels PXL constituting each pixel unit PXU are not particularly limited. In an example, the color of light emitted by each pixel PXL may be variously changed.

The pixel PXL may include at least one light source driven by a control signal (e.g., a scan signal and a data signal) and/or a power source (e.g., a first power source and a second power source). In an embodiment, the light source may include at least one light emitting element LD in accordance with an embodiment shown in FIGS. 1 and 2, e.g., a subminiature pillar-shaped light emitting element LD having a size small to a degree of nanometer scale to micrometer scale. However, the disclosure is not necessarily limited thereto. Various types of light emitting elements LD may be used as the light source of the pixel PXL.

In an embodiment, each pixel PXL may be configured as an active pixel. However, the kind, structure, and/or driving method of pixels PXL which can be applied to the display device are not particularly limited. For example, each pixel PXL may be configured as a pixel of a passive or active light emitting display device using various structures and/or driving methods.

Figure 4:
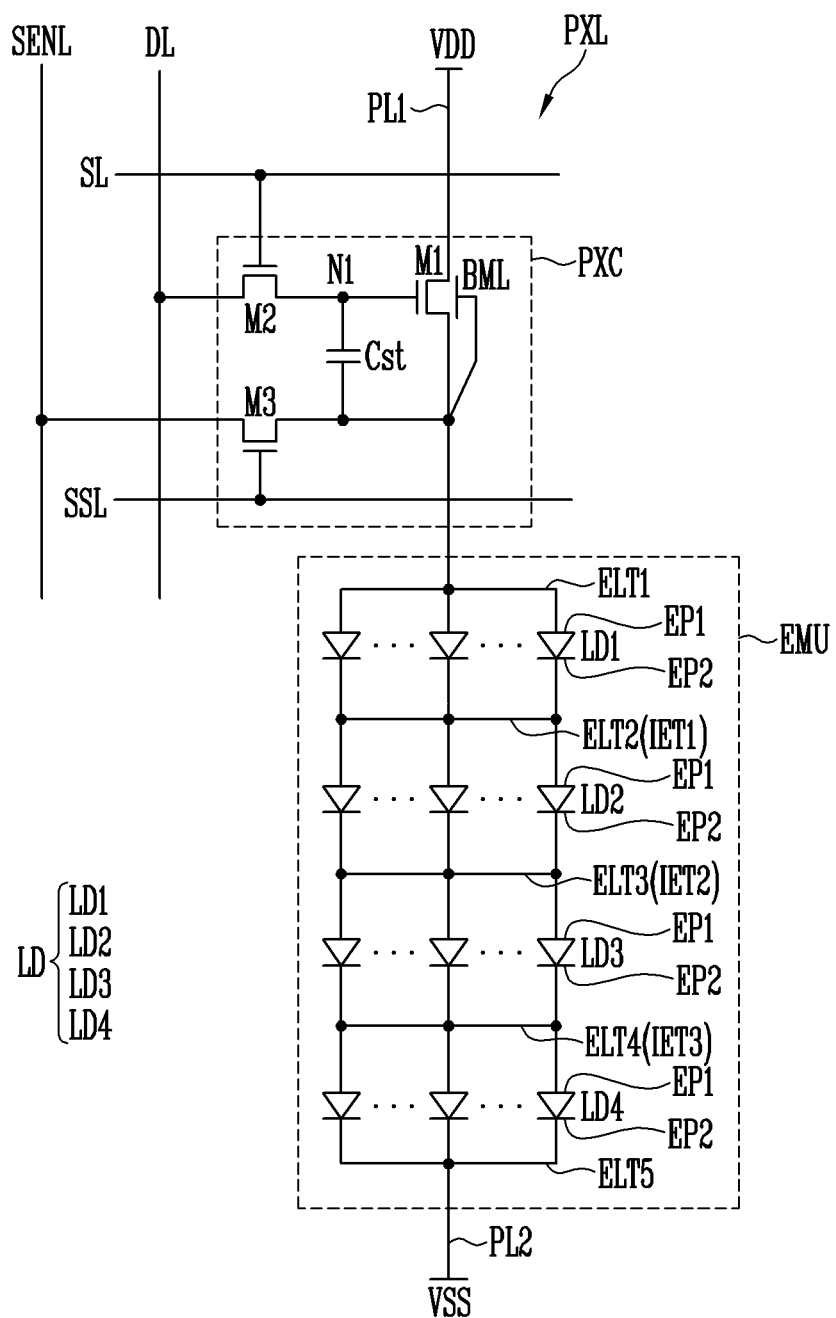
FIG. 4 is a schematic circuit diagram illustrating a pixel in accordance with an embodiment of the disclosure.

FIG. 4 is a schematic circuit diagram illustrating a pixel in accordance with an embodiment of the disclosure.

The pixel PXL shown in FIG. 4 may be any one of the first pixel PXL1, the second pixel PXL2, and the third pixel PXL3, which may be provided in the display panel PNL shown in FIG. 3. The first pixel PXL1, the second pixel PXL2, and the third pixel PXL3 may have structures substantially identical or similar to one another.

Referring to FIG. 4, the pixel PXL may include a light emitting unit EMU for generating light with a luminance corresponding to a data signal and a pixel circuit PXC for driving the light emitting unit EMU.

The pixel circuit PXC may be connected between a first power source VDD and the light emitting unit EMU. Also, the pixel circuit PXC may be connected to a scan line SL and a data line DL of the corresponding pixel PXL, to control an operation of the light emitting unit EMU, corresponding to a scan signal and the data signal, which may be supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connection electrode ELT1. A gate electrode of the first transistor M1 may be connected to a first node N1. The first transistor M1 may control a driving current supplied to the light emitting unit EMU, corresponding to a voltage of the first node N1. For example, the first transistor M1 may be a driving transistor for controlling the driving current of the pixel PXL.

In an embodiment, the first transistor M1 may selectively include a lower conductive layer BML (also referred to as a "lower electrode," a "back gate electrode," or a "lower light blocking layer"). The gate electrode and the lower conductive layer BML of the first transistor M1 may overlap with each other with an insulating layer interposed therebetween. In an embodiment, the lower conductive layer BML may be connected to one electrode, e.g., a source or drain electrode of the first transistor M1.

In case that the first transistor M1 includes the lower conductive layer BML, there may be applied a back-biasing technique (or sync technique) for moving a threshold voltage of the first transistor M1 in a negative direction or positive direction by applying a back-biasing voltage to the lower conductive layer BML of the first transistor M1 in driving of the pixel PXL. In an example, a source-sync technique may be applied by connecting the lower conductive layer BML to a source electrode of the first transistor M1, so that the threshold voltage of the first transistor M1 can be moved in the negative direction or positive direction. In case that the lower conductive layer BML is disposed on the bottom of a semiconductor pattern constituting a channel of the first transistor M1, the lower conductive layer BML serves as a light blocking pattern, thereby stabilizing operational characteristics of the first transistor M1. However, the function and/or application method of the lower conductive layer BML is not limited thereto.

The second transistor M2 may be connected between the data line DL and the first node N1. A gate electrode of the second transistor M2 may be connected to the scan line SL. The second transistor M2 may be turned on in case that a scan signal having a gate-on voltage (e.g., a high level voltage) is supplied from the scan line SL, to connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage may be supplied. For example, the second transistor M2 may be a switching transistor for transferring each data signal to the inside of the pixel PXL.

An electrode of the storage capacitor Cst may be connected to the first node N1, and another electrode of the storage capacitor Cst may be connected to a second electrode of the first transistor M1. The storage capacitor Cst may charge a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL may be compensated.

Although a case where the transistors included in the pixel circuit PXC may all be implemented with an n-type transistor has been illustrated in FIG. 4, the disclosure is not limited thereto. For example, at least one of the first, second, and third transistors M1, M2, and M3 may be changed to a p-type transistor.

The structure and driving method of the pixel PXL may be variously changed in some embodiments. For example, the pixel circuit PXC may be configured as a pixel circuit having various structures and/or various driving methods, in addition to an embodiment shown in FIG. 4.

In an example, the pixel circuit PXC may not include the third transistor M3. Also, the pixel circuit PXC may further include other circuit elements such as a compensation transistor for compensating for the threshold voltage of the first transistor M1, etc., an initialization transistor for initializing a voltage of the first node N1 and/or the first connection electrode ELT1, an emission control transistor for controlling a period in which a driving current may be supplied to the light emitting unit EMU, and/or a boosting capacitor for boosting the voltage of the first node N1.

The light emitting unit EMU may include at least one light emitting element LD, e.g., multiple light emitting elements LD connected between the first power source VDD and a second power source VSS.

For example, the light emitting unit EMU may include the first connection electrode ELT1 connected to the first power source VDD through the pixel circuit PXC and a first power line PL1, a fifth connection electrode ELT5 connected to the second power source VSS through a second power line PL2, and multiple light emitting elements LD connected between the first and fifth connection electrodes ELT1 and ELT5.

The first power source VDD and the second power source VSS may have different potentials such that the light emitting elements LD can emit light. In an example, the first power source VDD may be set as a high-potential power source, and the second power source VSS may be set as a low-potential power source.

In an embodiment, the light emitting unit EMU may include at least one serial stage. Each serial stage may include a pair of electrodes (e.g., two electrodes) and at least one light emitting element LD connected in a forward direction between the pair of electrodes. The number of serial stages constituting the light emitting unit EMU and the number of light emitting elements LD constituting each serial stage are not particularly limited. In an example, numbers of light emitting elements LD constituting the respective serial stages may be equal to or different from each other, and a number of light emitting elements LD is not particularly limited.

For example, the light emitting unit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 connected between the first and second connection electrodes ELT1 and ELT2. Each first light emitting element LD1 may be connected in the forward direction between the first and second connection electrodes ELT1 and ELT2. For example, a first end portion EP1 of the first light emitting element LD1 may be connected to the first connection electrode ELT1, and a second end portion EP2 of the first light emitting element LD1 may be connected to the second connection electrode ELT2.

The second serial stage may include the second connection electrode ELT2 and a third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, a first end portion EP1 of the second light emitting element LD2 may be connected to the second connection electrode ELT2, and a second end portion EP2 of the second light emitting element LD2 may be connected to the third connection electrode ELT3.

The third serial stage may include the third connection electrode ELT3 and a fourth connection electrode ELT4, and at least one third light emitting element LD3 connected between the third and fourth connection electrodes ELT3 and ELT4. Each third light emitting element LD3 may be connected in the forward direction between the third and fourth connection electrodes ELT3 and ELT4. For example, a first end portion EP1 of the third light emitting element LD3 may be connected to the third connection electrode ELT3, and a second end portion EP2 of the third light emitting element LD3 may be connected to the fourth connection electrode ELT4.

The fourth serial stage may include the fourth connection electrode ELT4 and the fifth connection electrode ELT5, and at least one fourth light emitting element LD4 connected between the fourth and fifth connection electrodes ELT4 and ELT5. Each fourth light emitting element LD4 may be connected in the forward direction between the fourth and fifth connection electrodes ELT4 and ELT5. For example, a first end portion EP1 of the fourth light emitting element LD4 may be connected to the fourth connection electrode ELT4, and a second end portion EP2 of the fourth light emitting element LD4 may be connected to the fifth connection electrode ELT5.

A first electrode, e.g., the first connection electrode ELT1 of the light emitting unit EMU may be an anode electrode of the light emitting unit EMU. A last electrode, e.g., the fifth connection electrode ELT5 of the light emitting unit EMU may be a cathode electrode of the light emitting unit EMU.

The other electrodes, e.g., the second connection electrode ELT2, the third connection electrode ELT3, and/or the fourth connection electrode ELT4 of the light emitting unit EMU may constitute respective intermediate electrodes. For example, the second connection electrode ELT2 may constitute a first intermediate electrode IET1, the third connection electrode ELT3 may constitute a second intermediate electrode IET2, and the fourth connection electrode ELT4 may constitute a third intermediate electrode IET3.

In case that light emitting elements LD are connected in a series/parallel structure, power efficiency can be improved as compared with a case where light emitting elements LD of which number may be equal to that of the above-described light emitting elements LD are connected only in parallel. In the pixel in which the light emitting elements LD may be connected in the series/parallel structure, although a short defect or the like occurs in some serial stages, a luminance can be expressed through light emitting elements LD of another serial stage. Hence, the probability that a dark spot defect will occur in the pixel PXL can be reduced. However, the disclosure is not necessarily limited thereto, and the light emitting unit EMU may be configured by connecting the light emitting elements LD only in series or by connecting the light emitting elements LD only in parallel.

Each of the light emitting elements LD may include a first end portion EP1 (e.g., a p-type end portion) connected to the first power source VDD via at least one electrode (e.g., the first connection electrode ELT1), the pixel circuit PXC, and/or the first power line PL1, and a second end portion EP2 (e.g., an n-type end portion) connected to the second power source VSS via at least another electrode (e.g., the fifth connection electrode ELT5) and the second power line PL2. For example, the light emitting elements LD may be connected in the forward direction between the first power source VDD and the second power source VSS. The light emitting elements LD connected in the forward direction may constitute effective light sources of the light emitting unit EMU.

In case that a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU can express the luminance corresponding to the driving current.

Figure 5:
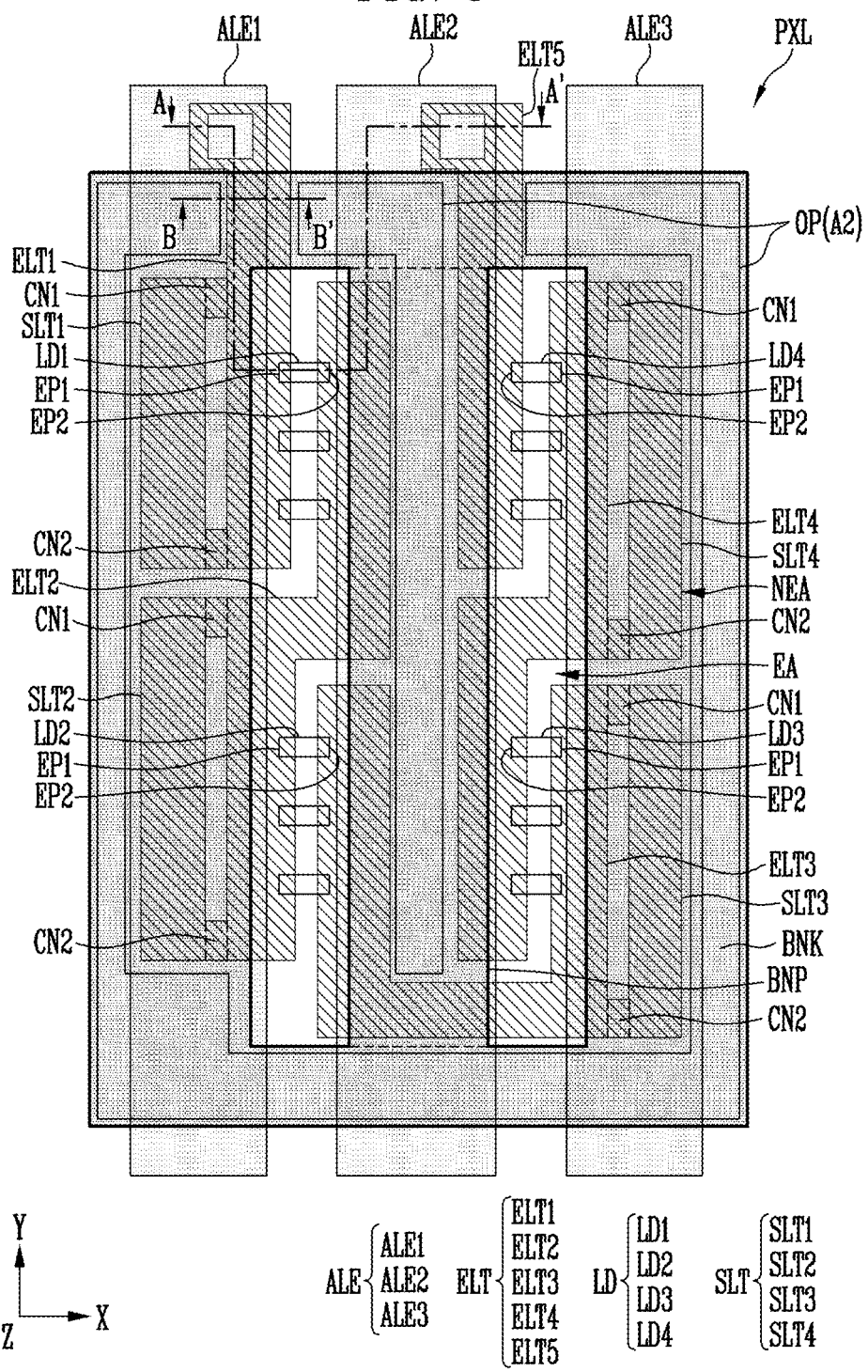
FIG. 5 is a schematic plan view illustrating a pixel in accordance with an embodiment of the disclosure.
Figure 6:
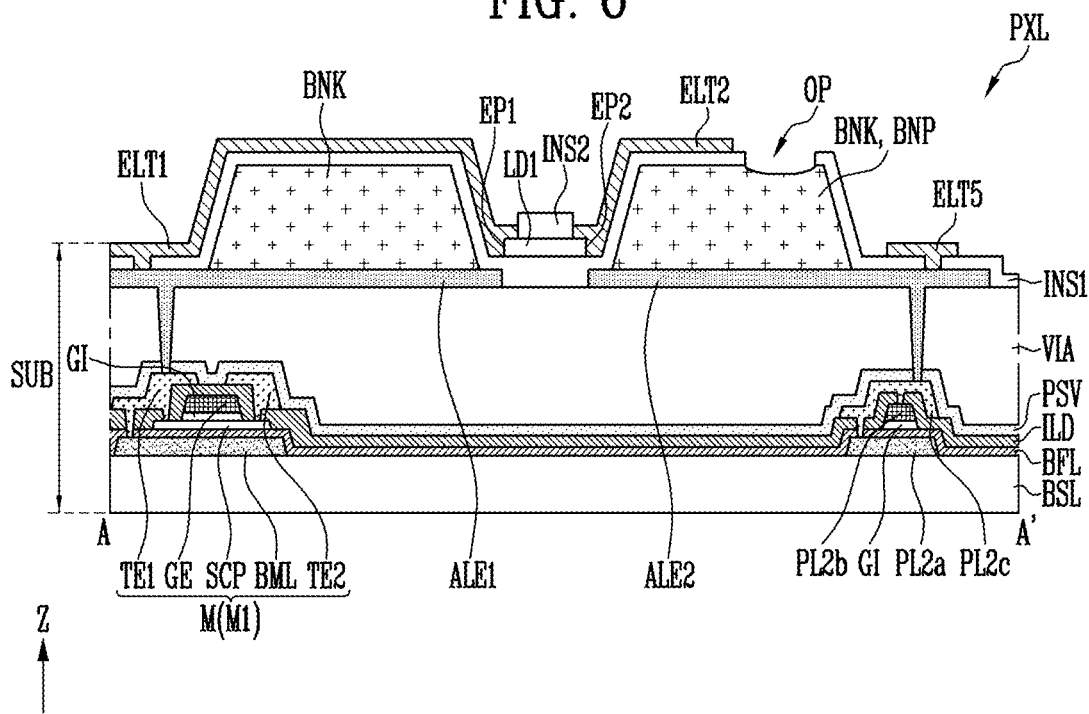
FIG. 6 is a schematic sectional view taken along line A-A' shown in FIG. 5.
Figure 7:
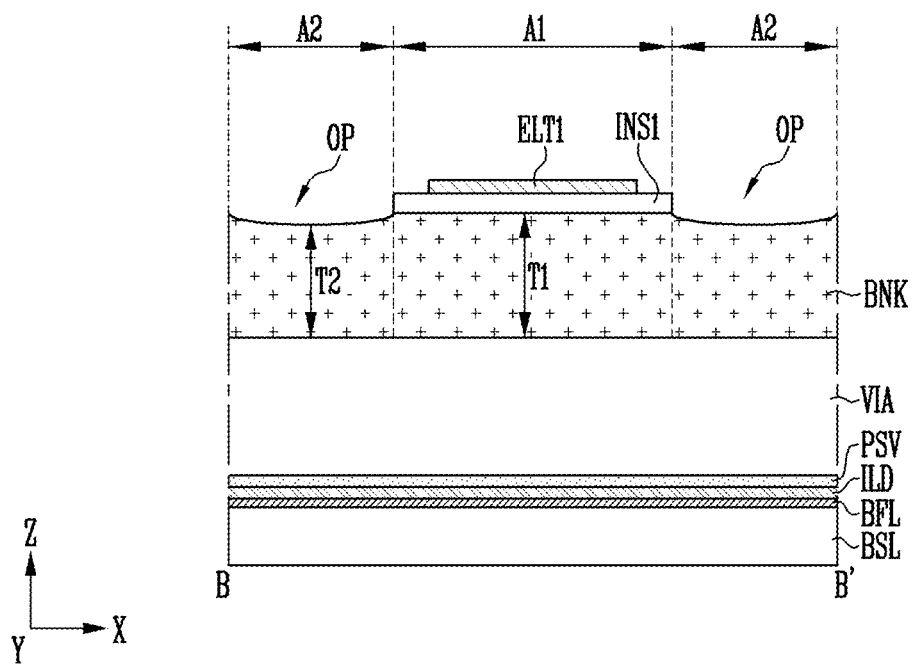
FIG. 7 is a schematic sectional view taken along line B-B' shown in FIG. 5.

FIG. 5 is a schematic plan view illustrating a pixel in accordance with an embodiment of the disclosure. FIG. 6 is a schematic sectional view taken along line A-A' shown in FIG. 5. FIG. 7 is a schematic sectional view taken along line B-B' shown in FIG. 5.

In an example, the pixel PXL shown in FIG. 5 may be any one of the first to third pixels PXL1, PXL2, and PXL3 constituting the pixel unit PXU shown in FIG. 3, and the first to third pixels PXL1, PXL2, and PXL3 may have structures substantially identical or similar to one another. Although an embodiment in which each pixel PXL includes light emitting elements LD disposed in four serial stages as shown in FIG. 4 is disclosed in FIG. 5, the number of serial stages of each pixel PXL may be variously changed in some embodiments.

Hereinafter, when at least one of first to fourth light emitting elements LD1, LD2, LD3, and LD4 is arbitrarily designated or when two or more kinds of light emitting elements are inclusively designated, the corresponding light emitting element or the corresponding light emitting elements will be referred to as a "light emitting element LD" or "light emitting elements LD." When at least one electrode among electrodes including first to third electrodes ALE1, ALE2, and ALE3 is arbitrarily designated or when two or more kinds of electrodes are inclusively designated, the corresponding electrode or the corresponding electrodes will be referred to as an "electrode ALE" or "electrodes ALE." When at least one connection electrode among connection electrodes including first to fifth connection electrodes ELT1, ELT2, ELT3, ELT4, and ELT5 is arbitrarily designated or when two or more kinds of connection electrodes are inclusively designated, the corresponding connection electrode or the corresponding connection electrodes will be referred to as a "connection electrode ELT" or "connection electrodes ELT." When at least one sub-electrode among sub-electrodes including first to fourth sub-electrodes SLT1, SLT2, SLT3, and SLT4 is arbitrarily designated or when two or more kinds of sub-electrodes are inclusively designated, the corresponding sub-electrode or the corresponding sub-electrodes will be referred to as a "sub-electrode SLT" or "sub-electrodes SLT."

Referring to FIG. 5, each pixel PXL may include an emission area EA and a non-emission area NEA. The emission area EA may be an area including light emitting elements LD to emit light. The non-emission area NEA may be disposed to surround the emission area EA. The non-emission area NEA may be an area in which a bank BNK surrounding the emission area EA may be provided.

Each pixel PXL may include a bank BNK, a bank pattern BNP, electrodes ALE, light emitting elements LD, connection electrodes ELT, and/or sub-electrodes SLT.

The bank BNK may be provided in the non-emission area NEA to be disposed to at least partially surround the emission area EA. The bank BNK may form a dam structure defining the emission area EA in which light emitting elements LD may be supplied in a process of supplying the light emitting elements LD to each of the pixels PXL. For example, the emission area EA may be partitioned by the bank BNK, so that a desired kind and/or amount of light emitting element ink can be supplied to the emission area EA.

The bank BNK may include at least one light blocking material and/or at least one reflective material. Accordingly, light leakage between adjacent pixels PXL can be prevented. For example, the bank BNK may include at least one black matrix material and/or at least one color filter material. In an example, the bank BNK may be formed as a black opaque pattern capable of blocking transmission of light.

The bank BNK may include an organic material such as acrylic resin, epoxy resin, phenolic resin, polyamide resin, polyimide resin, polyester resin, poly-phenylene sulfide resin, or benzocyclobutene (BCB), or a combination thereof. However, the disclosure is not necessarily limited thereto, and the bank BNK may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The bank pattern BNP may be disposed in the emission area EA to provide a space in which the light emitting elements LD can be provided or aligned. In an example, a desired kind and/or amount of light emitting element ink may be supplied to the emission area EA surrounded by the bank BNK and the bank pattern BNP. The bank pattern BNP may extend along a second direction (Y-axis direction).

The bank pattern BNP may include an organic material such as acrylic resin, epoxy resin, phenolic resin, polyamide resin, polyimide resin, polyester resin, poly-phenylene sulfide resin, or benzocyclobutene (BCB), or a combination thereof. However, the disclosure is not necessarily limited thereto, and the pattern BNP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide (ZrO$_x$), hafnium oxide (HfO$_x$), and titanium oxide (TiO$_x$), or a combination thereof.

The bank BNK and the bank pattern BNP may be made of a same material. For example, the bank BNK and the bank pattern BNP may be integrally provided. The bank BNK and the bank pattern BNP may be simultaneously formed through a same process, but the disclosure is not necessarily limited thereto.

The electrodes ALE may be provided in at least the emission area EA. The electrodes ALE may extend along the second direction (Y-axis direction), and be spaced apart from each other along a first direction (X-axis direction).

Each of the first to third electrodes ALE1, ALE2, and ALE3 may extend along the second direction (Y-axis direction), and the first to third electrodes ALE1, ALE2, and ALE3 may be spaced apart from each other along the first direction (X-axis direction) to be sequentially disposed. Some of the electrodes ALE may be connected to the pixel circuit (PXC shown in FIG. 4) and/or a power line through contact holes. For example, the first electrode ALE1 may be connected to the pixel circuit PXC and/or the first power line PL1 through a contact hole, and the second electrode ALE may be connected to the second power line PL2 through a contact hole.

In some embodiments, some of the electrodes ALE may be electrically connected to some of the connection electrodes ELT through contact holes. For example, the first electrode ALE1 may be electrically connected to the first connection electrode ELT1 through a contact hole, and the second electrode ALE2 may be electrically connected to the fifth connection electrode ELT5 through a contact hole. For example, the connection electrodes ELT may be connected to the pixel circuit and/or a power line through the electrodes ALE. However, the disclosure is not necessarily limited thereto, and the connection electrodes ELT may be directly connected to the pixel circuit and/or a power line so as to minimize contact resistance.

A pair of electrodes ALE adjacent to each other may be supplied with different signals in a process of aligning the light emitting elements LD. For example, in case that the first to third electrodes ALE1, ALE2, and ALE3 are sequentially arranged along the first direction (X-axis direction), the first electrode ALE1 and the second electrode ALE2 may be supplied with different alignment signals, and the second electrode ALE2 and the third electrode ALE3 may be supplied with different alignment signals.

Each of the light emitting elements LD may be aligned between a pair of electrodes ALE in the emission area EA. Also, each of the light emitting elements LD may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. In an example, the first light emitting element LD1 may be aligned in a first area (e.g., an upper end area) of the first and second electrodes ALE1 and ALE2. A first end portion EP1 of the first light emitting element LD1 may be electrically connected to the first connection electrode ELT1, and a second end portion of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. In an example, the second light emitting element LD2 may be aligned in a second area (e.g., a lower end area) of the first and second electrodes ALE1 and ALE2. A first end portion EP1 of the second light emitting element LD2 may be electrically connected to the second connection electrode ELT2, and a second end portion of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. In an example, the third light emitting element LD3 may be aligned in a second area (e.g., a lower end area) of the second and third electrodes ALE2 and ALE3. A first end portion EP1 of the third light emitting element LD3 may be electrically connected to the third connection electrode ELT3, and a second end portion of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. In an example, the fourth light emitting element LD4 may be aligned in a first area (e.g., an upper end area) of the second and third electrodes ALE2 and ALE3. A first end portion EP1 of the fourth light emitting element LD4 may be electrically connected to the fourth connection electrode ELT4, and a second end portion of the fourth light emitting element LD4 may be electrically connected to the fifth connection electrode ELT5.

In an example, the first light emitting element LD1 may be located in a left upper end area of the emission area EA, and the second light emitting element LD2 may be located in a left lower end area of the emission area EA. The third light emitting element LD3 may be located in a right lower end area of the emission area EA, and the fourth light emitting element LD4 may be located in a right upper end area of the emission area EA. However, the arrangement and/or connection structure of the light emitting elements LD may be variously changed according to the structure of the light emitting unit EMU and/or the number of serial stages.

Each of the connection electrodes ELT may be provided in at least the emission area EA, and be disposed to overlap with at least one electrode ALE and/or at least one light emitting element LD. For example, each of the connection electrodes ELT may be formed on the electrodes ALE and/or the light emitting elements LD to overlap with the electrodes ALE and/or the light emitting elements LD. Therefore, each of the electrodes ELT may be electrically connected to the light emitting elements LD.

The first connection electrode ELT1 may be disposed on the first area (e.g., the upper end area) of the first electrode ALE1 and the first end portions EP1 of the first light emitting elements LD1, to be electrically connected to the first end portions EP1 of the first light emitting elements LD1.

The second connection electrode ELT2 may be disposed on the first area (e.g., the upper end area) of the second electrode ALE2 and the second end portions EP2 of the first light emitting elements LD1, to be electrically connected to the second end portions EP2 of the first light emitting elements LD1. Also, the second connection electrode ELT2 may be disposed on the second area (e.g., the lower end area) of the first electrode ALE1 and the first end portions EP1 of the second light emitting elements LD2, to be electrically connected to the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other in the emission area EA. To this end, the second connection electrode ELT2 may have a bent shape. For example, the second connection electrode ELT2 may have a structure bent or curved at a boundary between an area in which at least one first light emitting element LD1 may be arranged and an area in which at least one second light emitting element LD2 may be arranged.

The third connection electrode ELT3 may be disposed on the second area (e.g., the lower end area) of the second electrode ALE2 and the second end portions EP2 of the second light emitting elements LD2, to be electrically connected to the second end portions EP2 of the second light emitting elements LD2. Also, the third connection electrode ELT3 may be disposed on the second area (e.g., the lower end area) of the third electrode ALE3 and the first end portions EP1 of the third light emitting elements LD3, to be electrically connected to the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other in the emission area EA. To this end, the third connection electrode ELT3 may have a bent shape. For example, the third connection electrode ELT3 may have a structure bent or curved at a boundary between an area in which at least one second light emitting element LD2 may be arranged and an area in which at least one third light emitting element LD3 may be arranged.

The fourth connection electrode ELT4 may be disposed on the second area (e.g., the lower end area) of the second electrode ALE2 and the second end portions EP2 of the third light emitting elements LD3, to be electrically connected to the second end portions EP2 of the third light emitting elements LD3. Also, the fourth connection electrode ELT4 may be disposed on the first area (e.g., the upper end area) of the third electrode ALE3 and the first end portions EP1 of the fourth light emitting elements LD4, to be electrically connected to the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other in the emission area EA. To this end, the fourth connection electrode ELT4 may have a bent shape. For example, the fourth connection electrode ELT4 may have a structure bent or curved at a boundary between an area in which at least one third light emitting element LD3 may be arranged and an area in which at least one fourth light emitting element LD4 may be arranged.

The fifth connection electrode ELT5 may be disposed on the first area (e.g., the upper end area) of the second electrode ALE2 and the second end portions EP2 of the fourth light emitting elements LD4, to be electrically connected to the second end portions EP2 of the fourth light emitting elements LD4.

In the above-described manner, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be sequentially connected in series by using the connection electrodes ELT.

The sub-electrodes SLT may be electrically connected respectively to the connection electrodes ELT. In an example, the first sub-electrode SLT1 may be electrically connected to the first connection electrode ELT1, the second sub-electrode SLT2 may be electrically connected to the second connection electrode ELT2, the third sub-electrode SLT3 may be electrically connected to the third connection electrode ELT3, and the fourth sub-electrode SLT4 may be electrically connected to the fourth connection electrode ELT4.

The first sub-electrode SLT1 may be integrally provided with the first connection electrode ELT1, the second sub-electrode SLT2 may be integrally provided with the second connection electrode ELT2, the third sub-electrode SLT3 may be integrally provided with the third connection electrode ELT3, and the fourth sub-electrode SLT4 may be integrally provided with the fourth connection electrode ELT4. However, the disclosure is not limited thereto.

The sub-electrodes SLT may be spaced apart from the connection electrodes ELT, so that the sub-electrodes SLT and the connection electrodes ELT may be electrically connected to each other through connection parts CN1 and CN2, respectively. In an example, an end of each of the sub-electrodes SLT may be electrically connected to each of the connection electrodes ELT through the first connection part CN1. Another end of each of the sub-electrodes SLT may be electrically connected to each of the connection electrodes ELT through the second connection part CN2. In an example, the first connection part CN1 and/or the second connection part CN2 may be integrally provided with the sub-electrodes SLT and/or connection electrodes ELT to be disposed in a same layer, but the disclosure is not necessarily limited thereto.

The sub-electrodes SLT may extend along the second direction (Y-axis direction), and be spaced apart from the connection electrodes ELT along the first direction (X-axis direction). As described above, in case that the sub-electrodes SLT electrically connected to the connection electrode ELT are formed, a dark spot defect of the pixel PXL can be reduced.

Hereinafter, a sectional structure of the pixel PXL will be described in detail with reference to FIGS. 6 and 7. FIG. 6 illustrates a light emitting substrate SUB. The first transistor M1 among various circuit elements constituting the pixel circuit (PXC shown in FIG. 4) is illustrated in FIG. 7. When the first to third transistors M1, M2, and M3 are designated without being distinguished from each other, each of the first to third transistors M1, M2, and M3 will be inclusively referred to as a "transistor M." The structure of transistors M and/or the positions of the transistors M for each layer are not limited to an embodiment shown in FIG. 6, and may be variously changed in some embodiments.

Referring to FIGS. 6 and 7, the light emitting substrate SUB of the pixel PXL in accordance with an embodiment of the disclosure may include circuit elements including transistors M disposed on a base layer BSL and various lines connected thereto. Electrodes ALE, light emitting elements LD, and/or connection electrodes, which constitute the bank BNK, the bank pattern BNP, and the light emitting unit EMU may be disposed above the circuit elements.

The base layer BSL may be used to constitute a base member, and may be a rigid or flexible substrate or a film. In an example, the base layer BSL may be a rigid substrate made of glass or tempered glass, a flexible substrate (or thin film) made of a plastic or metal material, or at least one insulating layer. The material and/or property of the base layer BSL is not particularly limited. In an embodiment, the base layer BSL may be substantially transparent. The term "substantially transparent" may mean that light can be transmitted with a transmittance or more. In another embodiment, the base layer BSL may be translucent or opaque. Also, the base layer BSL may include a reflective material in some embodiments.

A lower conductive layer BML and a first power conductive layer PL2a may be disposed on the base layer BSL. The lower conductive layer BML and the first power conductive layer PL2a may be disposed in a same layer. For example, the lower conductive layer BML and the first power conductive layer PL2a may be simultaneously formed through a same process, but the disclosure is not necessarily limited thereto. The first power conductive layer PL2a may constitute the second power line PL2 described with reference to FIG. 4 and the like.

Each of the lower conductive layer BML and the first power conductive layer PL2a may be formed as a single layer or a multi-layer, which may be made of at least one of molybdenum (Mo), copper (Cu), aluminum (Al), chromium (Cr), gold (Au), titanium (Ti), nickel (Ni), neodymium (Nd), and indium (In), tin (Sn), and any oxide or ally thereof.

A buffer layer BFL may be disposed over the lower conductive layer BML and the first power conductive layer PL2a. The buffer layer BFL may prevent an impurity from being diffused into each circuit element. The buffer layer BFL may be configured as a single layer, but may be configured as a multi-layer including at least two layers. In case that the buffer layer BFL is provided as the multi-layer, the layers may be formed of a same material or be formed of different materials.

A semiconductor pattern SCP may be disposed on the buffer layer BFL. In an example, the semiconductor pattern SCP may include a first region in contact with a first transistor electrode TE1, a second region in contact with a second transistor electrode TE2, and a channel region located between the first and second regions. In some embodiments, one of the first and second regions may be a source region, and the other of the first and second regions may be a drain region.

In some embodiments, the semiconductor pattern SCP may be made of poly-silicon, amorphous silicon, oxide semiconductor, etc., or a combination thereof. The channel region of the semiconductor pattern SCP may be a semiconductor pattern undoped with an impurity, and may be an intrinsic semiconductor. Each of the first and second regions of the semiconductor pattern SCP may be a semiconductor pattern doped with an impurity.

A gate insulating layer GI may be disposed on the buffer layer BFL and the semiconductor pattern SCP. In an example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The gate electrode GE of the transistor M and the second power conductive layer PL2b may be disposed on the gate insulating layer GI. For example, the gate electrode GE and the second power conductive layer PL2b may be disposed in a same layer. For example, the gate electrode GE and the second power conductive layer PL2b may be simultaneously formed through a same process, but the disclosure is not necessarily limited thereto. The gate electrode GE may be disposed on the gate insulating layer GI to overlap with the semiconductor pattern SCP in a third direction (Z-axis direction). The second power conductive layer PL2b may be disposed on the gate insulating layer GI to overlap with the first power conductive layer PL2a in the third direction (Z-axis direction). The second power conductive layer PL2b along with the first power conductive layer PL2a may constitute the second power line PL2 described with reference to FIG. 4 and the like.

Each of the gate electrode GE and the second power conductive layer PL2b may be formed as a single layer or a multi-layer, which may be made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof. For example, each of the gate electrode GE and the second power conductive layer PL2b may be formed as a multi-layer in which titanium (Ti), copper (Cu), and/or indium tin oxide (ITO) may be sequentially or repeatedly stacked.

An interlayer insulating layer ILD may be disposed over the gate electrode GE and the second power conductive layer PL2b. In an example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

The interlayer insulating layer ILD may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed in a same layer. For example, the first and second transistor electrodes TE1 and TE2 and the third power conductive layer PL2c may be simultaneously formed through a same process, but the disclosure is not necessarily limited thereto.

The first and second transistor electrodes TE1 and TE2 may be disposed to overlap with the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. Also, the first transistor electrode TE1 may be electrically connected to the lower conductive layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In some embodiments, any one of the first and second transistor electrodes TE1 and TE2 may be a source electrode, and the other of the first and second transistor electrodes TE1 and TE2 may be a drain electrode.

The third power conductive layer PL2c may be disposed to overlap with the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole penetrating the interlayer insulating layer ILD and the buffer layer BFL. Also, the third power conductive layer PL2c may be electrically connected to the second power conductive layer PL2b through a contact hole penetrating the interlayer insulating layer ILD. The third power conductive layer PL2c along with the first power conductive layer PL2a and/or the second power conductive layer PL2b may constitute the second power line PL2 described with reference to FIG. 4 and the like.

The first and second transistor electrodes TE1 and TE2 and the third power conductive layer PL2c may be formed as a single layer or a multi-layer, which may be made of at least one of molybdenum (Mo), copper (Cu), aluminum (Al), chromium (Cr), gold (Au), titanium (Ti), nickel (Ni), neodymium (Nd), indium (In), tin (Sn), and any oxide or alloy thereof.

A protective layer PSV may be disposed over the first and second transistor electrodes TE1 and TE2 and the third power conductive layer PL2c. The protective layer PSV may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

A via layer VIA may be disposed on the protective layer PSV. The via layer VIA may be made of an organic material to planarize a lower step difference. For example, the via layer VIA may include an organic material such as acrylic resin, epoxy resin, phenolic resin, polyamides resin, polyimides resin, polyester resin, poly-phenylene sulfide resin, or benzocyclobutene (BCB), or a combination thereof. However, the disclosure is not necessarily limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

Electrodes ALE may be disposed on the via layer VIA. The electrodes ALE may be disposed to be spaced apart from each other. For example, the electrodes ALE may be simultaneously formed through a same process, but the disclosure is not necessarily limited thereto.

The electrodes ALE may be supplied with an alignment signal in a process of aligning the light emitting elements LD. Accordingly, an electric field may be formed between the electrodes ALE, so that the light emitting elements LD provided in each pixel PXL can be aligned between the electrodes ALE.

The electrodes ALE may include at least one conductive material. In an example, the electrodes ALE may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the disclosure is not necessarily limited thereto.

A first electrode ALE1 may be electrically connected to the first transistor electrode TE1 of the transistor M through a contact hole penetrating the via layer VIA and the protective layer PSV. A second electrode ALE2 may be electrically connected to the third power conductive layer PL2c through a contact hole penetrating the via layer VIA and the protective layer PSV.

A bank BNK and/or a bank pattern BNP may be disposed on the electrodes ALE. In some embodiments, the bank BNK may have various shapes. In an embodiment, the bank BNK may have a shape protruding in the third direction (Z-axis direction) on the base layer BSL. Also, the bank BNK may have an inclined surface inclined at an angle with respect to the base layer BSL. However, the disclosure is not necessarily limited thereto, and the bank BNK may have a sidewall having a curved shape, a stepped shape, or the like. In an example, the bank BNK may have a section having a semicircular shape, a semi-elliptical shape, or the like.

The bank BNK may include at least one organic material and/or at least one inorganic material. In an example, the bank BNK may include an organic material such as acrylic resin, epoxy resin, phenolic resin, polyamide resin, polyimide resin, polyester resin, poly-phenylene sulfide resin, or benzocyclobutene (BCB), or a combination thereof. However, the disclosure is not necessarily limited thereto, and the bank BNK may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

In some embodiments, the bank pattern BNP may have various shapes. In an embodiment, the bank pattern BNP may have a shape protruding in the third direction (Z-axis direction) on the base layer BSL. Also, the bank pattern BNP may have an inclined surface inclined at an angle with respect to the base layer BSL. However, the disclosure is not necessarily limited thereto, and the bank pattern BNP may have a sidewall having a curved shape, a stepped shape, or the like. In an example, the bank pattern BNP may have a section having a semicircular shape, a semi-elliptical shape, or the like.

The bank pattern BNP may include at least one organic material and/or at least one inorganic material. In an example, the bank pattern BNP may include an organic material such as acrylic resin, epoxy resin, phenolic resin, polyamide resin, polyimide resin, polyester resin, poly-phenylene sulfide resin, or benzocyclobutene (BCB), or a combination thereof. However, the disclosure is not necessarily limited thereto, and the bank pattern BNP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The bank BNK and the bank pattern BNP may provide a space in which the light emitting elements LD can be provided. The bank BNK and the bank pattern BNP may be made of a same material. For example, the bank BNK and the bank pattern BNP may be simultaneously formed through a same process, but the disclosure is not necessarily limited thereto.

A first insulating layer INS1 may be disposed over the bank BNK and the bank pattern BNP. The first insulating layer INS1 may include an opening OP overlapping with the bank BNK. The opening OP of the first insulating layer INS1 may at least partially expose the bank BNK. In an example, the first insulating layer INS1 may cover a side surface of the bank BNK, and include the opening OP partially exposing at least a portion of a top surface of the bank BNK. The first insulating layer INS1 may cover a first area A1, and may include the opening OP exposing a second area A2.

The second area A2 of the bank BNK, which may be exposed by the opening OP of the first insulating layer INS, may have water repellency. In an example, the second area A2 of the bank BNK may be water repellent treated through the opening OP of the first insulating layer INS1. A light emitting element ink may be readily provided to a space surrounded by the second area A2 of the bank BNK, which have the water repellency, so that the alignment of the light emitting elements LD can be improved. This will be described in detail later with reference to FIG. 14.

The second area A2 of the bank BNK may be partially etched in a process of forming the opening OP of the first insulating layer INS1. For example, a thickness T1 of the first area A1 of the bank BNK in the third direction (Z-axis direction) may be thicker than a thickness T2 of the second area A2 of the bank BNK in the third direction (Z-axis direction). In some embodiments, in case that the second area A2 of the bank BNK is partially etched, an undercut may occur in the second area A2 of the bank BNK. In order to prevent disconnection between connection electrodes ELT due to the undercut of the bank BNK, the connection electrodes ELT may be formed on the first area A1 of the bank BNK, which may be protected by the first insulating layer INS1. Accordingly, the light emitting elements LD can be readily provided, and simultaneously, the disconnection between the connection electrodes ELT can be prevented.

The first insulating layer INS1 may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The light emitting elements LD may be disposed on the first insulating layer INS1. The light emitting elements LD may be disposed between the electrodes ALE on the first insulating layer INS1.

The light emitting elements LD may be prepared in a form in which the light emitting elements LD may be dispersed in a light emitting element ink, to be supplied to each of the pixels PXL through an inkjet printing process, or the like. In an example, the light emitting elements LD may be dispersed in a volatile solvent to be provided to each pixel PXL. Subsequently, in case that an alignment signal is supplied through the electrodes ALE, the light emitting elements LD may be aligned between the electrodes ALE, while an electric field may be formed between the electrodes ALE. After the light emitting elements LD may be aligned, the solvent may be volatilized or removed through other processes, so that the light emitting elements LD can be stably arranged between the electrodes ALE.

A second insulating layer INS2 may be disposed on the light emitting elements LD. For example, the second insulating layer INS2 may be partially provided on the light emitting elements LD, and expose first and second end portions EP1 and EP2 of the light emitting elements LD. In case that the second insulating layer INS2 is formed on the light emitting elements LD after the alignment of the light emitting elements LD may be completed, the light emitting elements LD can be prevented from being separated from a position at which the light emitting elements LD may be aligned.

The second insulating layer INS2 may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The connection electrodes ELT may be disposed on the first and second end portions EP1 and EP2 of the light emitting elements LD, which may be exposed by the second insulating layer INS2. As described above, the connection electrodes ELT may be formed on the first area A1 of the bank BNK so as to prevent the disconnection due to the undercut of the bank BNK. For example, the connection electrode ELT may not overlap with the opening OP of the first insulating layer INS1. The connection electrodes ELT may be directly disposed on the first insulating layer INS1.

A first connection electrode ELT1 may be directly disposed on first end portions EP1 of first light emitting elements LD1, to be in contact with the first end portions EP1 of the first light emitting elements LD1.

A second connection electrode ELT2 may be directly disposed on second end portions EP2 of the first light emitting elements LD1, to be in contact with the second end portions EP2 of the first light emitting elements LD1. Also, the second connection electrode ELT2 may be directly disposed on first end portions of second light emitting elements LD2, to be in contact with the first end portions of the second light emitting elements LD2. For example, the second connection electrode ELT2 may electrically connect the second end portions EP2 of the first light emitting elements LD1 and the first end portions of the second light emitting elements LD2 to each other.

Similarly, a third connection electrode ELT3 may be directly disposed on second end portions of the second light emitting elements LD2, to be in contact with the second end portions of the second light emitting elements LD2. Also, the third connection electrode ELT3 may be directly disposed on first end portions of third light emitting elements LD3, to be in contact with the first end portions of the third light emitting elements LD3. For example, the third connection electrode ELT3 may electrically connect the second end portions of the second light emitting elements LD2 and the first end portions of the third light emitting elements LD3 to each other.

Similarly, a fourth connection electrode ELT4 may be directly disposed on second end portions EP2 of the third light emitting elements LD3, to be in contact with the second end portions EP2 of the third light emitting elements LD3. Also, the fourth connection electrode ELT4 may be directly disposed on first end portions EP1 of fourth light emitting elements LD4, to be in contact with the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other.

Similarly, a fifth connection electrode ELT5 may be directly disposed on second end portions EP2 of the fourth light emitting elements LD4, to be in contact with the second end portions EP2 of the fourth light emitting elements LD4.

The first connection electrode ELT1 may be electrically connected to the first electrode ALE1 through a contact hole penetrating the first insulating layer INS1. The fifth connection electrode ELT5 may be electrically connected to the second electrode ALE2 through a contact hole penetrating the first insulating layer INS1.

In an embodiment, the connection electrodes ELT may be disposed in a same layer. For example, the connection electrodes ELT may be simultaneously formed through a same process. Accordingly, a number of masks may be decreased, so that a manufacturing process can be simplified.

The connection electrodes ELT may be made of various transparent conductive materials. In an example, the connection electrodes ELT may include at least one of various transparent conductive materials including Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and be implemented substantially transparently or translucently to satisfy a transmittance. Accordingly, light emitted from the first and second end portions EP1 and EP2 of the light emitting elements LD can be emitted to the outside of the display panel PNL while passing through the connection electrodes ELT.

In accordance with the above-described embodiment, the light emitting elements LD may be readily provided by water repellent treating the second area A2 of the bank BNK, and simultaneously, the connection electrodes ELT may be formed on the first area A1 of the bank BNK, so that the disconnection between the connection electrodes ELT due to the undercut of the bank BNK can be prevented.

Figure 8:
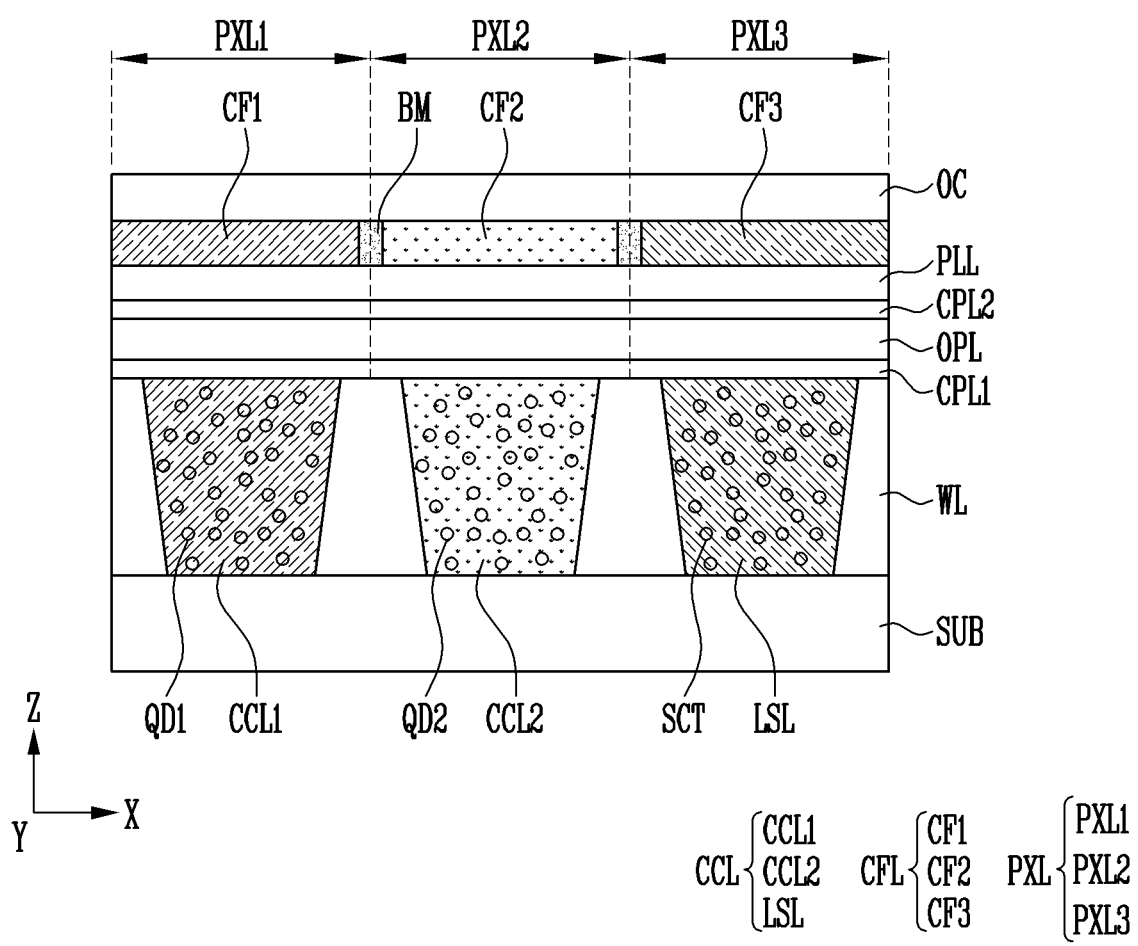
FIG. 8 is a schematic sectional view illustrating first to third pixels in accordance with an embodiment of the disclosure.

FIG. 8 is a schematic sectional view illustrating first to third pixels in accordance with an embodiment of the disclosure.

FIG. 8 illustrates a partition wall WL, a color conversion layer CCL, an optical layer OPL, and/or a color filter layer CFL, which may be provided on the light emitting substrate SUB of the pixel PXL described with reference to FIG. 6.

Referring to FIG. 8, the partition wall WL may be disposed on the light emitting element substrate SUB of the first to third pixels PXL1, PXL2, and PXL3. In an example, the partition wall WL may be disposed between the first to third pixels PXL1, PXL2, and PXL3 or at a boundary between the first to third pixels PXL1, PXL2, and PXL3, and include an opening overlapping with each of the first to third pixels PXL1, PXL2, and PXL3. The opening of the partition wall WL may provide a space in which the color conversion layer CCL can be provided.

The partition wall WL may include an organic material such as acrylic resin, epoxy resin, phenolic resin, polyamide resin, polyimide resin, polyester resin, poly-phenylene sulfide resin, or benzocyclobutene (BCB), or a combination thereof. However, the disclosure is not necessarily limited thereto, and the partition wall WL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

In some embodiments, the partition wall WL may include at least one light blocking and/or reflective material. Accordingly, light leakage between adjacent pixels PXL can be prevented. For example, the partition wall WL may include at least one black matrix material and/or at least one color filter material. In an example, the partition wall WL may be formed as a black opaque pattern capable of blocking transmission of light. In an embodiment, a reflective layer (not shown) or the like may be formed on a surface (e.g., a sidewall) of the partition wall WL so as to improve the light efficiency of each pixel PXL.

The color conversion layer CCL may be disposed on the light emitting substrate SUB including the light emitting elements LD in the opening of the partition wall WL. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of a same color. For example, the first to third pixels PXL1, PXL2, and PXL3 may include light emitting elements LD emitting light of a third color (or blue). The color conversion layer CCL including color conversion particles may be disposed on each of the first to third pixels PXL1, PXL2, and PXL3, so that a full-color image can be displayed.

The first color conversion layer CCL1 may include first color conversion particles for converting light of the third color, which may be emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting blue light, and the first pixel PXL1 is a red pixel, the first color conversion layer CCL1 may include a first quantum dot QD1 for converting blue light, which may be emitted from the blue light emitting element, into red light. The first quantum dot QD1 may absorb blue light and emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

The second color conversion layer CCL2 may include second color conversion particles for converting light of the third color, which may be emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting blue light, and the second pixel PXL2 is a green pixel, the second color conversion layer CCL2 may include a second quantum dot QD2 for converting blue light, which may be emitted from the blue light emitting element, into green light. The second quantum dot QD2 may absorb blue light and emit green light by shifting a wavelength of the blue light according to energy transition. In case that the second pixel PXL2 is a pixel of another color, the second color conversion layer CCL2 may include a second quantum dot QD2 corresponding to the color of the second pixel PXL2.

In an embodiment, blue light having a relatively short wavelength in a visible light band may be incident into the first quantum dot QD1 and the second quantum dot QD2, so that absorption coefficients of the first quantum dot QD1 and the second quantum dot QD2 can be increased. Accordingly, the efficiency of light finally emitted from the first pixel PXL1 and the second pixel PXL2 can be improved, and excellent color reproduction can be ensured. The light emitting unit EMU of each of the first to third pixels PXL1, PXL2, and PXL3 may be configured by using light emitting elements of a same color (e.g., blue light emitting elements), so that the manufacturing efficiency of the display device can be improved.

The light scattering layer LSL may be provided to efficiently use light of the third color (or blue) emitted from the light emitting element LD. In an example, in case that the light emitting element LD is a blue light emitting element emitting blue light, and the third pixel PXL3 is a blue pixel, the light scattering layer LSL may include at least one kind of light scattering particles SCT to efficiently use light emitted from the light emitting element LD.

For example, the light scattering layer LSL may include light scattering particles SCT dispersed in a matrix material such as base resin. In an example, the light scattering layer LSL may include a light scattering particle SCT such as silica, but the material constituting the light scattering particles SCT is not limited thereto. The light scattering particles SCT may not be disposed in only the third pixel PXL3, and may be selectively included even at the inside of the first color conversion layer CCL1 or the second color conversion layer CCL2. In some embodiments, the light scattering particle may be omitted such that the light scattering layer LSL configured with transparent polymer may be provided.

A first capping layer CPL1 may be disposed on the color conversion layer CCL. The first capping layer CPL1 may be provided through the first to third pixels PXL1, PXL2, and PXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, or a combination thereof.

An optical layer OPL may be disposed on the first capping layer CPL1. The optical layer OPL may function to improve light extraction efficiency by recycling light provided from the color conversion layer CCL through total reflection. To this end, the optical layer OPL may have a refractive index relatively lower than that of the color conversion layer CCL. For example, the refractive index of the color conversion layer may be about 1.6 to about 2.0, and the refractive index of the optical layer OPL may be about 1.1 to about 1.3.

A second capping layer CPL2 may be disposed on the optical layer OPL. The second capping layer CPL2 may be provided through the first to third pixels PXL1, PXL2, and PXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, or a combination thereof.

A planarization layer PLL may be disposed on the second capping layer CPL2. The planarization layer PLL may be provided throughout the first to third pixels PXL1, PXL2, and PXL3.

The planarization layer PLL may include an organic material such as acrylic resin, epoxy resin, phenolic resin, polyamides resin, polyimides resin, unsaturated polyesters resin, poly-phenylene ethers resin, poly-phenylene sulfides resin, or benzocyclobutene (BCB), or a combination thereof. However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

The color filter layer CFL may be disposed on the planarization layer PLL. The color filter layer CFL may include color filters CF1, CF2, and CF3 which may accord with a color of each pixel PXL. The color filters CF1, CF2, and CF3 which accord with a color of each of the first to third pixels PXL1, PXL2, and PXL3 may be disposed, so that a full-color image can be displayed.

The color filter layer CFL may include a first color filter CF1 disposed in the first pixel PXL1 to allow light emitted from the first pixel PXL1 to be selectively transmitted therethrough, a second color filter CF2 disposed in the second pixel PXL2 to allow light emitted from the second pixel PXL2 to be selectively transmitted therethrough, and a third color filter CF3 disposed in the third pixel PXL3 to allow light emitted from the third pixel PXL3 to be selectively transmitted therethrough.

In an embodiment, the first color filter CF1, the second color filter CF2, and the third color filter CF3 may be respectively a red color filter, a green color filter, and a blue color filter, but the disclosure is not necessarily limited thereto. Hereinafter, when an arbitrary color filter among the first color filter CF1, the second color filter CF2, and the third color filter CF3 is designated or when two or more kinds of color filters are inclusively designated, the corresponding color filter or the corresponding color filters are referred to as a "color filter CF" or "color filters CF."

The first color filter CF1 may overlap with the light emitting substrate SUB (or the light emitting element LD) and the first color conversion layer CCL of the first pixel PXL1 in the third direction (Z-axis direction). The first color filter CF1 may include a color filter material for allowing light of a first color (or red) to be selectively transmitted therethrough. For example, in case that the first pixel PXL1 is a red pixel, the first color filter CF1 may include a red color filter material.

The second color filter CF2 may overlap with the light emitting substrate SUB (or the light emitting element LD) and the second color conversion layer CCL of the second pixel PXL2 in the third direction (Z-axis direction). The second color filter CF2 may include a color filter material for allowing light of a second color (or green) to be selectively transmitted therethrough. For example, in case that the second pixel PXL2 is a green pixel, the second color filter CF2 may include a green color filter material.

The third color filter CF3 may overlap with the light emitting substrate SUB (or the light emitting element LD) and the light scattering layer LSL of the third pixel PXL3 in the third direction (Z-axis direction). The third color filter CF3 may include a color filter material for allowing light of a third color (or blue) to be selectively transmitted therethrough. For example, in case that the third pixel PXL3 is a blue pixel, the third color filter CF3 may include a blue color filter material.

In some embodiments, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device can be prevented. The material of the light blocking layer BM is not particularly limited, and the light blocking layer BM may be configured with various light blocking materials. In an example, the light blocking layer BM may be implemented by stacking the first to third color filters CF1, CF2, and CF3.

An overcoat layer OC may be disposed on the color filter layer CFL. The overcoat layer OC may be provided throughout the first to third pixels PXL1, PXL2, and PXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as acrylic resin, epoxy resin, phenolic resin, polyamides resin, polyimides resin, unsaturated polyesters resin, poly-phenylene ethers resin, poly-phenylene sulfides resin, or benzocyclobutene (BCB), or a combination thereof. However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

Hereinafter, another embodiment will be described. In the following embodiment, components identical to those which have already been described are designated by like reference numerals, and overlapping descriptions will be omitted or simplified.

Figure 9:
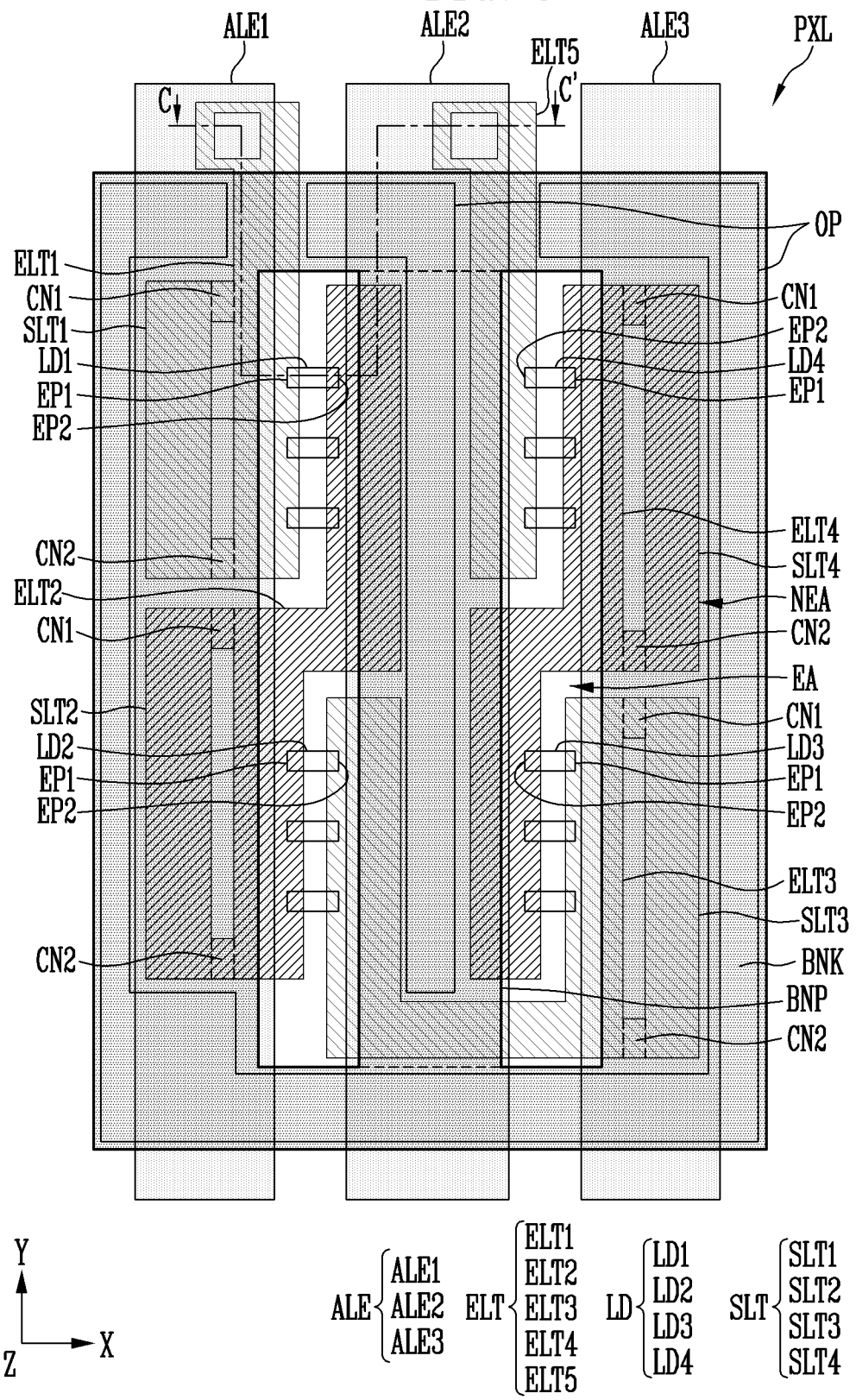
FIG. 9 is a schematic plan view illustrating a pixel in accordance with another embodiment of the disclosure.
Figure 10:
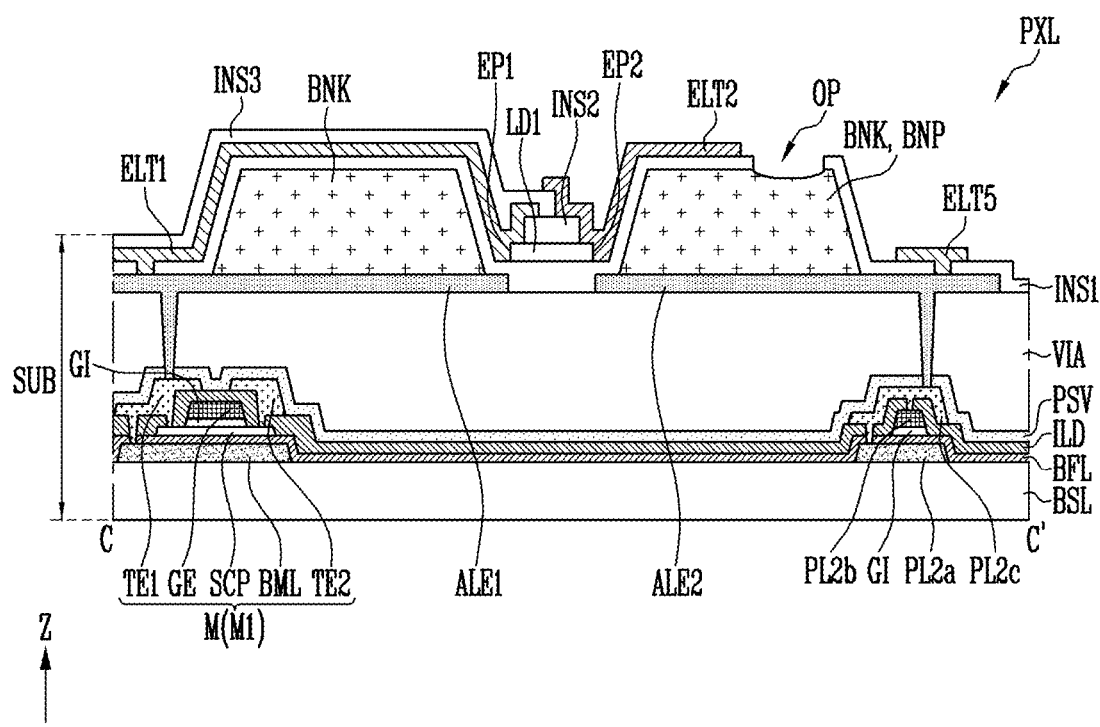
FIG. 10 is a schematic sectional view taken along line C-C' shown in FIG. 9.

FIG. 9 is a schematic plan view illustrating a pixel in accordance with another embodiment of the disclosure. FIG. 10 is a schematic sectional view taken along line C-C' shown in FIG. 9.

Referring to FIGS. 9 and 10, the connection electrodes ELT may be configured as conductive layers. For example, the first connection electrode ELT1, the third connection electrode ELT3, and the fifth connection electrode ELT5 may be disposed in a same layer. The second connection electrode ELT2 and the fourth connection electrode ELT4 may be disposed in a same layer. In an example, the first connection electrode ELT1, the third connection electrode ELT3, and the fifth connection electrode ELT5 may be disposed on the second insulating layer INS2. A third insulating layer INS3 may be disposed over the first connection electrode ELT1, the third connection electrode ELT3, and the fifth connection electrode ELT5. The second connection electrode ELT2 and the fourth connection electrode ELT4 may be disposed on the third insulating layer INS3.

As described above, in case that the third insulating layer INS3 is disposed between the connection electrodes ELT configured as different conductive layers, the connection electrodes ELT can be stably separated by the third insulating layer INS3. Thus, the electrical stability between the first and second end portions EP1 and EP2 of the light emitting elements LD can be ensured.

The third insulating layer INS3 may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A method of manufacturing the display device in accordance with an embodiment described above will now be described.

FIGS. 11 to 16 are schematic process sectional views illustrating a method of manufacturing the display device in accordance with an embodiment of the disclosure. FIGS. 11 to 16 are sectional views illustrating a method of manufacturing the display device based on FIGS. 6 and 7. In FIGS. 11 to 16, components substantially identical or similar to those shown in FIGS. 6 and 7 are designated by like reference numerals, and detailed reference numerals will be omitted.

Figure 11:
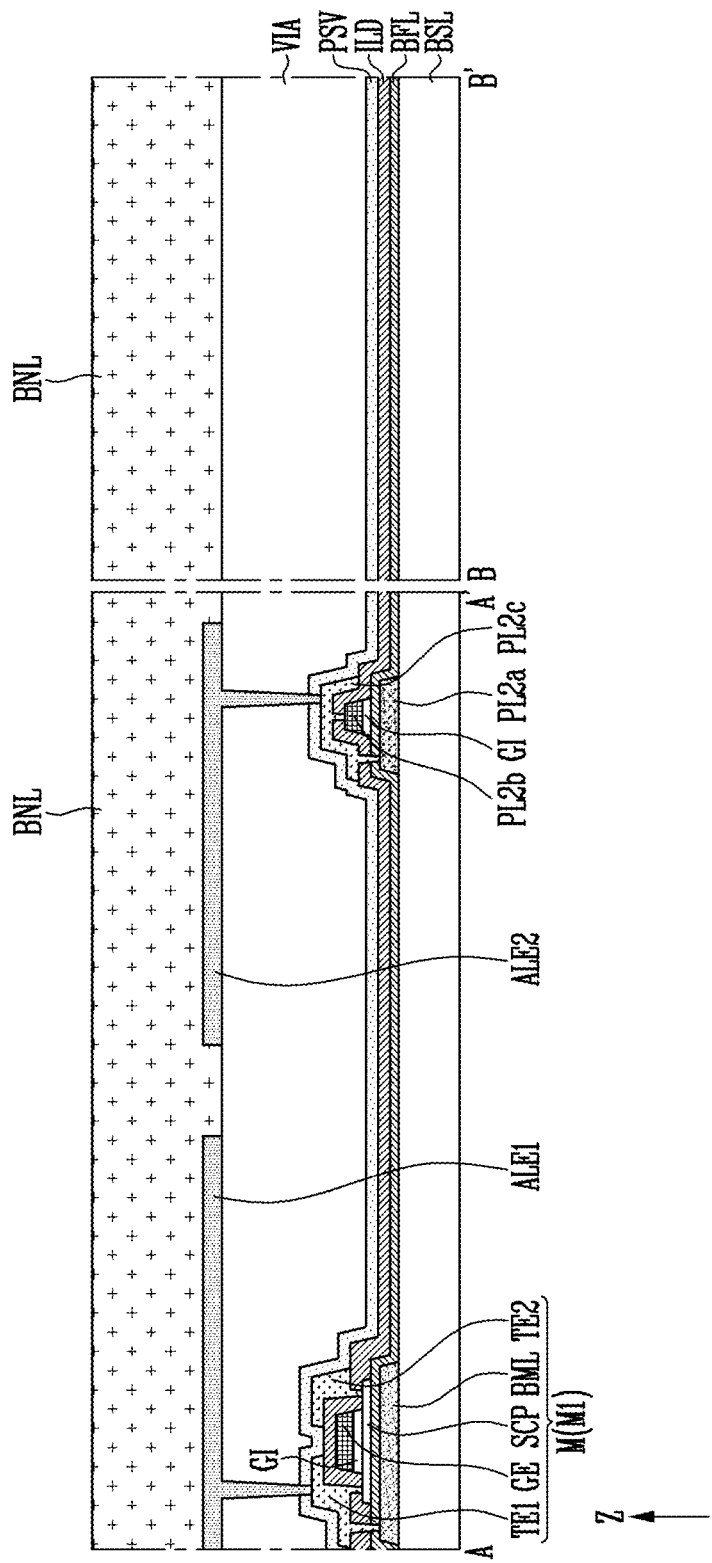
FIGS. 11 to 16 are schematic process sectional views illustrating a method of manufacturing the display device in accordance with an embodiment of the disclosure.

First, referring to FIG. 11, electrodes ALE and a bank layer BNL may be formed on a base layer BSL on which circuit elements including a transistor M and various lines connected thereto may be formed. The electrodes ALE may be formed to be spaced apart from each other in an emission area EA. The electrodes ALE may be simultaneously formed through a same process. A first electrode ALE1 may be electrically connected to a first transistor electrode TE1 of the transistor M through a contact hole penetrating a via layer VIA and a protective layer PSV. A second electrode ALE2 may be electrically connected to a third power conductive layer PL2c through a contact hole penetrating the via layer VIA and the protective layer PSV.

The bank layer BNL may be formed over the electrodes ALE. The bank layer BNL may include an organic material such as acrylic resin, epoxy resin, phenolic resin, polyamides resin, polyimides resin, unsaturated polyesters resin, poly-phenylene ethers resin, poly-phenylene sulfides resin, or benzocyclobutene (BCB), or a combination thereof. However, the disclosure is not necessarily limited thereto, and the bank layer BNL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), or a combination thereof.

Figure 12:
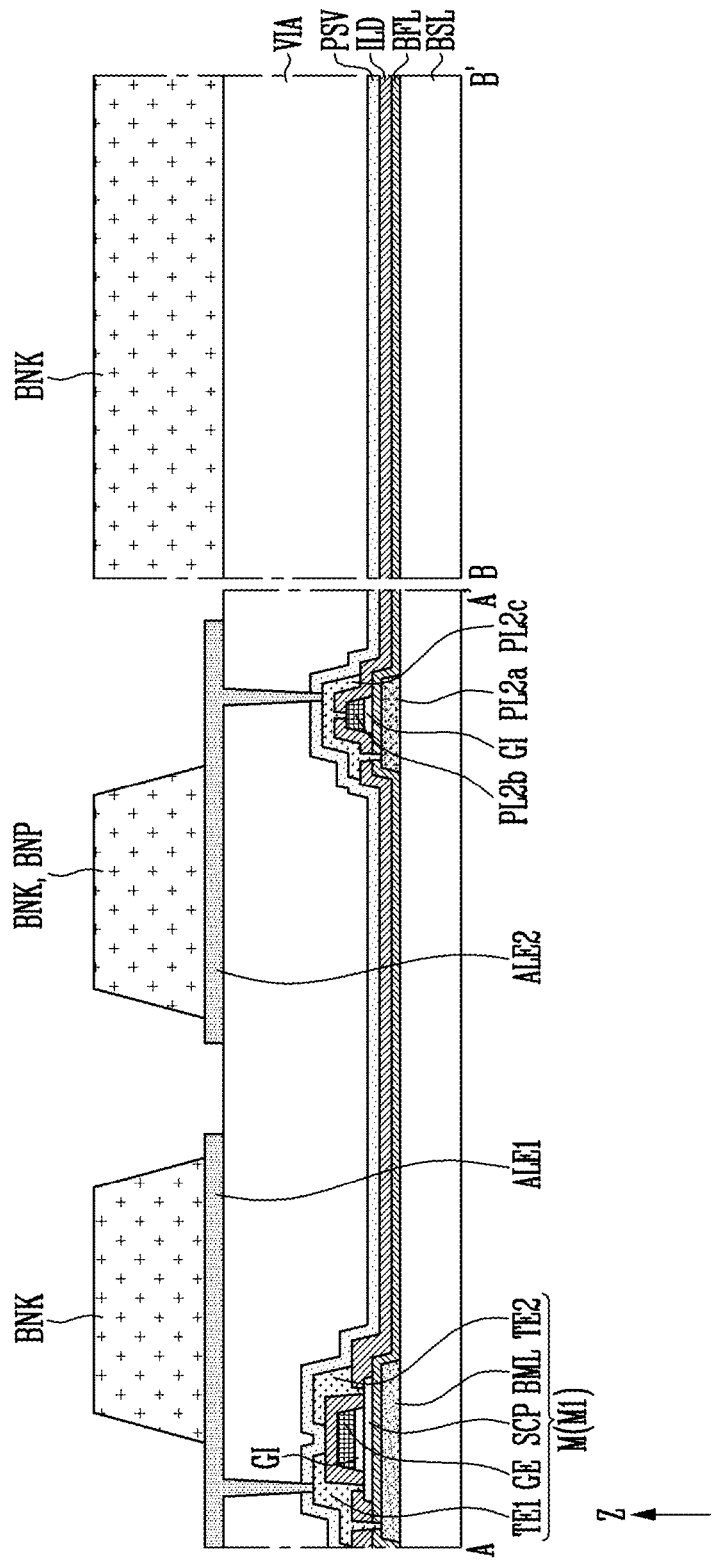

Referring to FIG. 12, subsequently, a bank BNK and a bank pattern BNP may be formed by etching the bank layer BNL. The bank BNK may be formed in a non-emission area NEA to at least partially surround the emission area EA. The bank BNK may form a dam structure defining the emission area EA in which light emitting elements LD may be supplied in a process of supplying the light emitting elements LD to each pixel PXL. For example, the emission area EA may be partitioned by the bank BNK, so that a desired kind and/or amount of light emitting element ink can be supplied to the emission area EA.

The bank pattern BNP may be disposed in the emission area EA to provide a space in which the light emitting elements LD can be provided or aligned. In an example, a desired kind and/or amount of light emitting element ink may be supplied to the emission area EA surrounded by the bank BNK and the bank pattern BNP.

Figure 13:
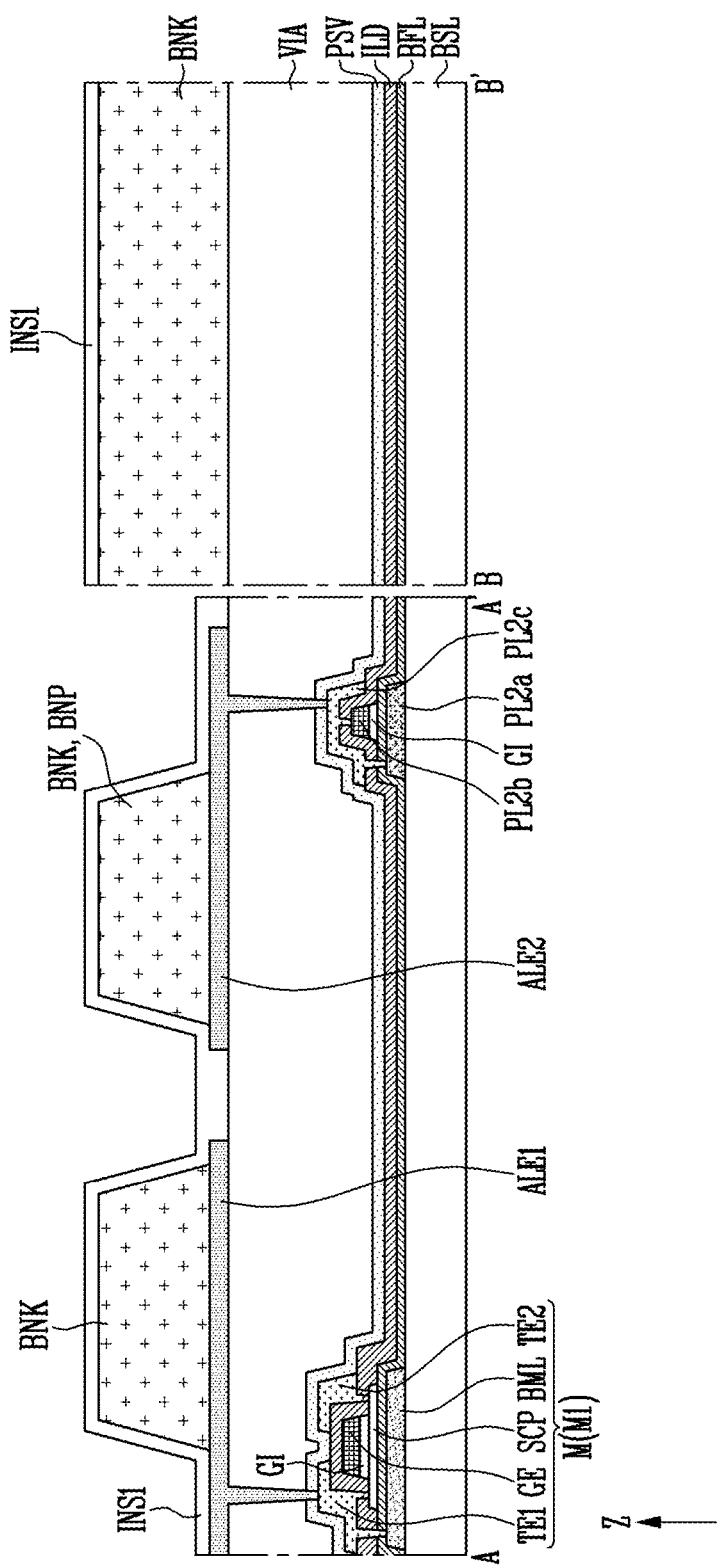

Referring to FIG. 13, subsequently, a first insulating layer INS1 may be formed over the electrodes ALE, the bank BNK, and the bank patterns BNP. The first insulating layer INS1 may cover the top and side surfaces of the electrodes ALE and the bank BNK and top and side surfaces of the bank pattern BNP. The first insulating layer INS1 may be formed as a single layer or a multi-layer, and be formed of various kinds of inorganic insulating materials, including silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$), or a combination thereof.

Figure 14:
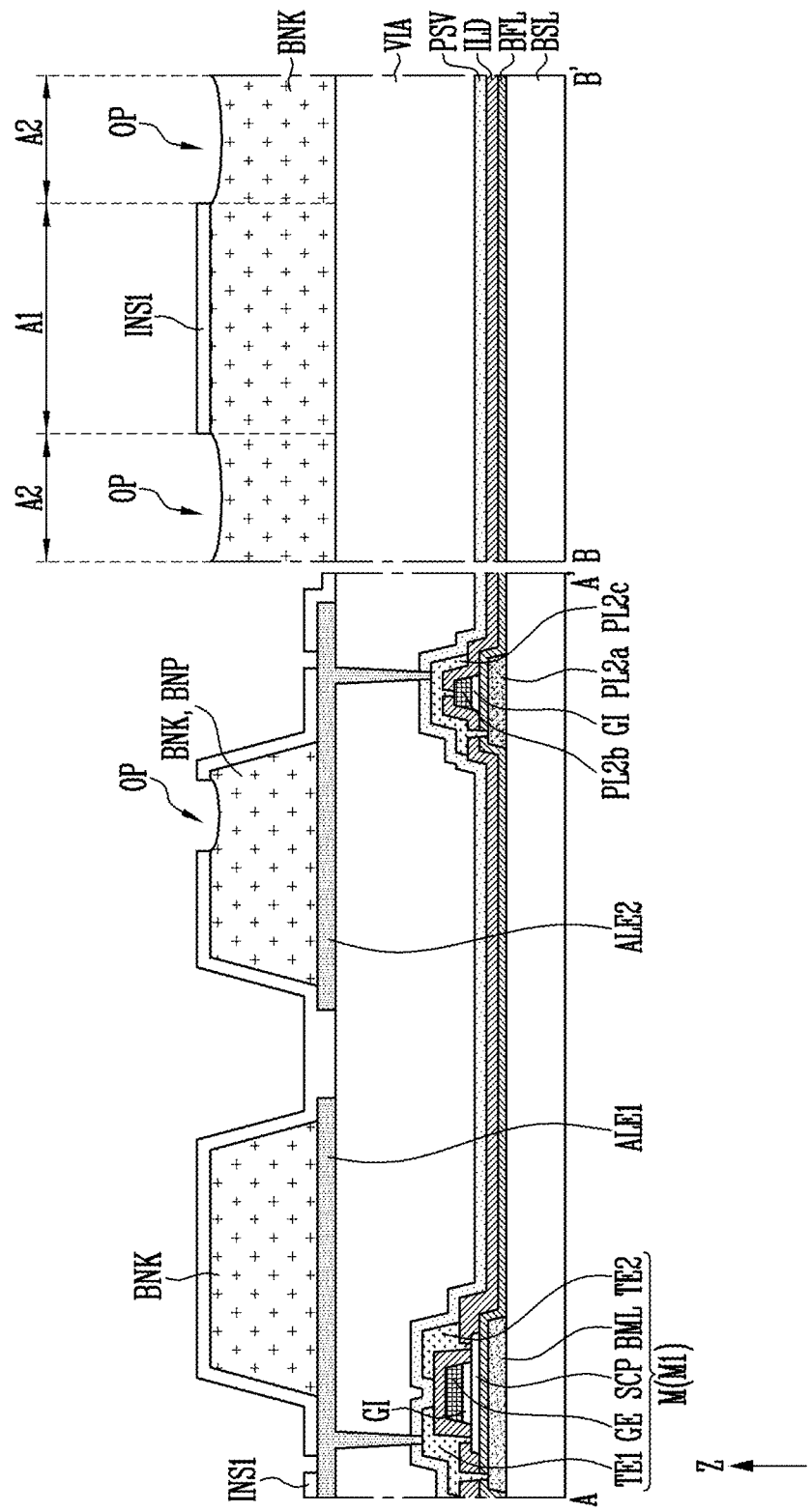

Referring to FIG. 14, subsequently, an opening OP may be formed by etching the first insulating layer INS1. The opening OP of the first insulating layer INS1 may at least partially expose the bank BNK. In an example, the first insulating layer INS1 may cover a side surface of the bank BNK, and include the opening OP partially exposing at least a portion of a top surface of the bank BNK. The first insulating layer INS1 may cover a first area A1, and may include the opening OP exposing a second area A2.

Subsequently, the second area A2 of the bank BNK may be surface treated through the opening OP of the first insulating layer INS1. In an example, a surface of the bank BNK may be plasma treated through the opening OP of the first insulating layer INS1 such that the second area A2 of the bank BNK has water repellency. Accordingly, a light emitting element ink can be readily provided in a space surrounded by the second area A2 of the bank BNK, which has the water repellency.

Figure 15:
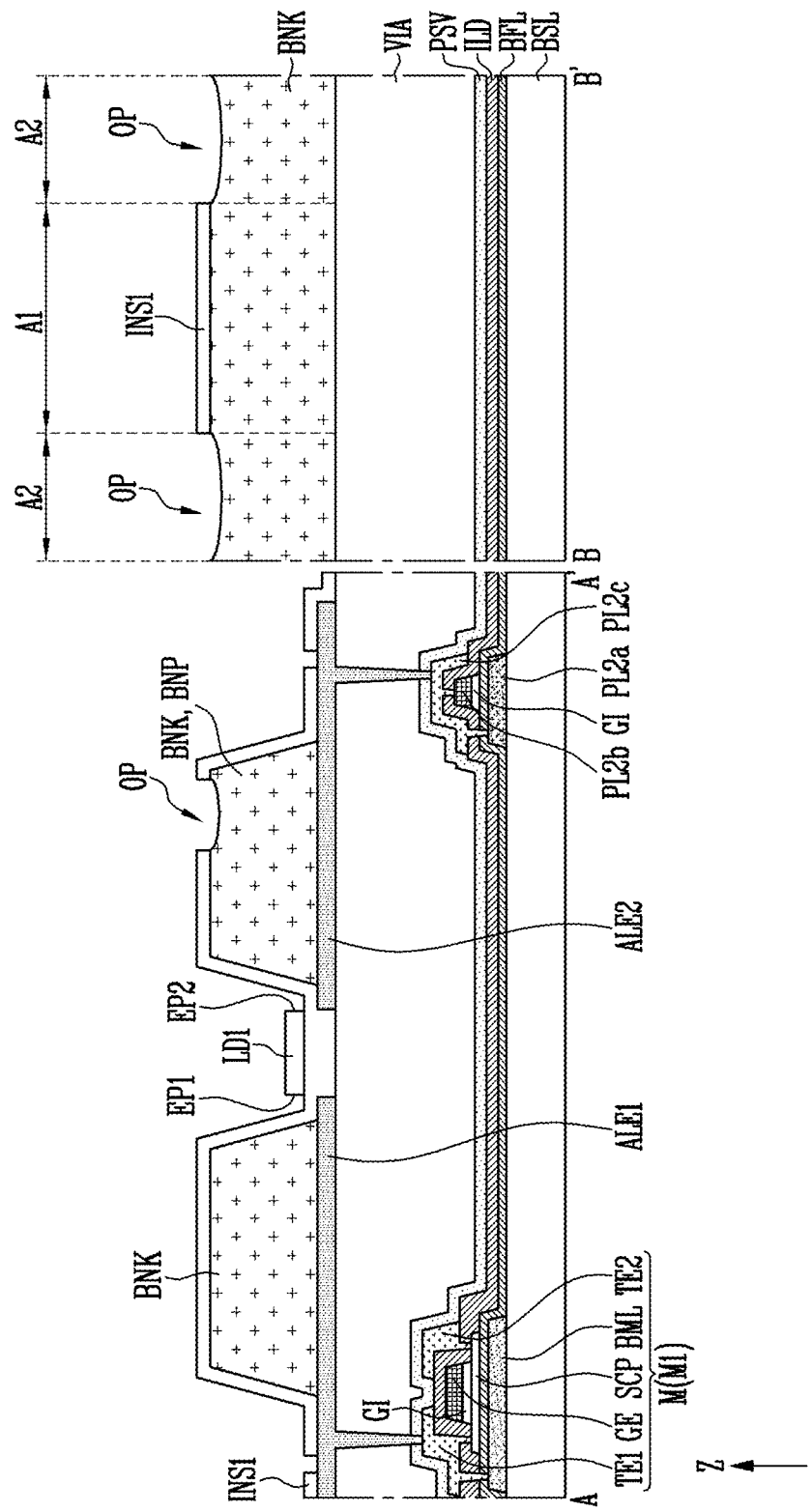

Referring to FIG. 15, subsequently, light emitting elements LD may be provided. The light emitting elements LD may be prepared in a form in which the light emitting elements LD may be dispersed in a light emitting element ink, to be supplied to each of the pixels PXL through an inkjet printing process, or the like. As described above, a desired kind and/or amount of light emitting element ink can be readily supplied to the emission area EA surrounded by the second area A2 of the bank BNK, which has the water repellency. The light emitting elements LD may be dispersed in a volatile solvent to be provided to each pixel PXL. Subsequently, in case that an alignment signal is supplied through the electrodes ALE, the light emitting elements LD may be aligned between the electrodes ALE, while an electric field may be formed between the electrodes ALE. After the light emitting elements LD may be aligned, the solvent may be volatilized or removed through other processes, so that the light emitting elements LD can be stably arranged between the electrodes ALE.

Figure 16:
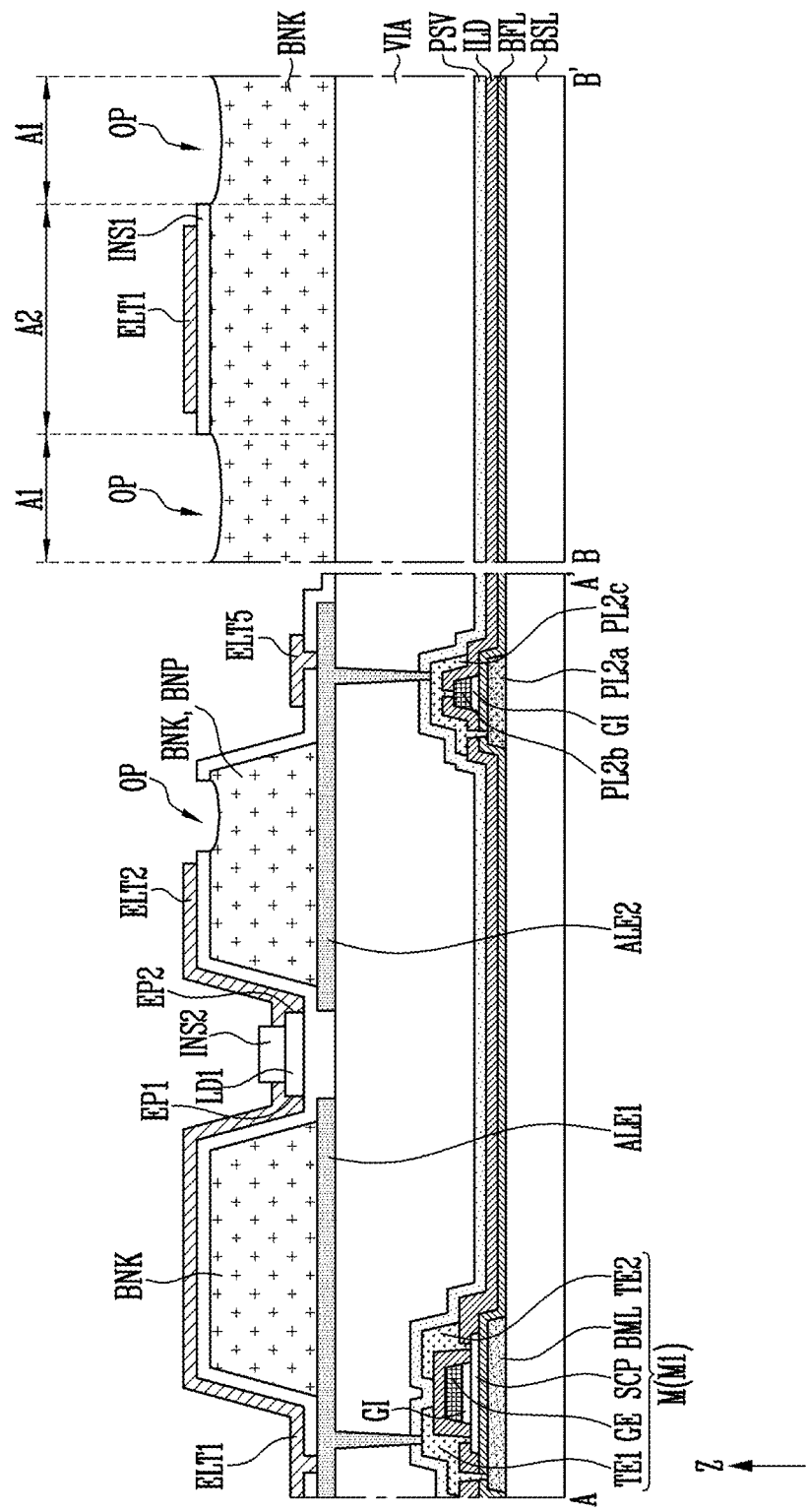

Referring to FIG. 16, subsequently, a second insulating layer INS2 may be formed on the light emitting elements LD, and connection electrodes ELT may be formed on end portions of the light emitting elements LD. As described above, the second area A2 of the bank BNK may be partially etched in a process of forming the opening OP by etching the first insulating layer INS1, and an undercut may occur in the second area A2 of the bank BNK. Therefore, in order to prevent disconnection between connection electrodes ELT due to the undercut of the bank BNK, the connection electrodes ELT may be formed on the first area A1 of the bank BNK, which may be protected by the first insulating layer INS1. For example, the connection electrodes ELT may be formed not to overlap with the opening OP of the first insulating layer INS1. The connection electrodes ELT may be directly formed on the first insulating layer INS1.

The connection electrodes ELT may be simultaneously formed through a same process. However, the disclosure is not necessarily limited thereto. As described with reference to FIG. 10, the connection electrodes ELT may be configured as conductive layers, and an insulating layer may be formed between the conductive layers, so that the connection electrodes ELT can be stably separated.

In accordance with the disclosure, light emitting elements can be readily provided by water repellent treating a second area of a bank, and simultaneously, connection electrodes may be formed on a first area of the bank, so that disconnection between the connection electrodes due to an undercut of the bank can be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with an embodiment may be used singly or in combination with features, characteristics, and/ or elements described in connection with other embodiments unless otherwise specifically indicated. Accordingly, it will be understood by those of skill in the art that various changes in form and details may be made without departing from the spirit and scope of the disclosure.

What is claimed is:

1. A display device comprising:
   a pixel including an emission area and a non-emission area;
   a bank disposed in the non-emission area;
   an insulating layer disposed on the bank;
   light emitting elements disposed in the emission area; and
   connection electrodes electrically connected to the light emitting elements, wherein
   the insulating layer overlaps a first area of the bank, and includes an opening exposing a second area of the bank in a plan view, and
   the connection electrodes overlap the first area of the bank in a plan view,
   wherein the connection electrodes do not overlap the opening of the insulating layer in a plan view.

2. The display device of claim 1, wherein the insulating layer overlaps a side surface of the bank in a plan view.

3. The display device of claim 1, wherein the second area of the bank is water repellant.

4. The display device of claim 1, further comprising:
   electrodes spaced apart from each other in the emission area,
   wherein the light emitting elements are disposed between the electrodes.

5. The display device of claim 4, wherein the insulating layer is disposed between the electrodes and the light emitting elements.

6. The display device of claim 1, wherein the connection electrodes include:
   a first connection electrode electrically connected to first end portions of the light emitting elements; and
   a second connection electrode electrically connected to second end portions of the light emitting elements.

7. The display device of claim 6, wherein the first connection electrode and the second connection electrode are disposed on a same layer.

8. The display device of claim 6, further comprising:
   another insulating layer disposed between the first connection electrode and the second connection electrode.

9. A display device comprising:
   a pixel including an emission area and a non-emission area;
   a bank disposed in the non-emission area;
   an insulating layer disposed on the bank;
   light emitting elements disposed in the emission area; and
   connection electrodes electrically connected to the light emitting elements, wherein the insulating layer overlaps a first area of the bank, and
includes an opening exposing a second area of the bank
in a plan view, and the connection electrodes overlap the first area of the bank
in a plan view, wherein a thickness of the first area of the bank is greater
than a thickness of the second area of the bank.

\* \* \* \* \*